(12) United States Patent
Komiyama et al.

(10) Patent No.: US 9,356,596 B2
(45) Date of Patent: May 31, 2016

(54) DRIVING CIRCUIT AND DRIVING METHOD

(71) Applicant: Sony Corporation, Tokyo (JP)

(72) Inventors: Shinji Komiyama, Saitama (JP);
Shinichi Fukuda, Kanagawa (JP);
Uichiro Omae, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/412,839

(22) PCT Filed: Jul. 2, 2013

(86) PCT No.: PCT/JP2013/068082
§ 371 (c)(1),
(2) Date: Jan. 5, 2015

(87) PCT Pub. No.: WO2014/010459
PCT Pub. Date: Jan. 16, 2014

(65) Prior Publication Data
US 2015/0155865 A1    Jun. 4, 2015

(30) Foreign Application Priority Data

Jul. 12, 2012    (JP) .................................. 2012-156199

(51) Int. Cl.
| H03B 1/00 | (2006.01) |
| H03K 3/00 | (2006.01) |
| H03K 17/687 | (2006.01) |
| H02J 5/00 | (2016.01) |
| H02J 7/02 | (2016.01) |

(52) U.S. Cl.
CPC .............. *H03K 17/687* (2013.01); *H02J 5/005* (2013.01); *H02J 7/025* (2013.01); *H03K 2217/009* (2013.01)

(58) Field of Classification Search
CPC ............................... H03K 17/687; H02J 7/025
USPC ............ 327/108–112, 427, 434, 437; 326/82, 326/83, 84–92
See application file for complete search history.

(56) References Cited

U.S. PATENT DOCUMENTS

| 2005/0001659 A1* | 1/2005 | Inoshita | H02M 1/08 327/108 |
| 2006/0290388 A1* | 12/2006 | Tolle | H03K 17/04123 327/108 |
| 2013/0009672 A1* | 1/2013 | Olivo | H03K 17/163 327/109 |

\* cited by examiner

*Primary Examiner* — Lincoln Donovan
*Assistant Examiner* — Thomas Skibinski
(74) *Attorney, Agent, or Firm* — Chip Law Group

(57) ABSTRACT

The present technology relates to a driving circuit and a driving method, in which power loss at the time of switching an FET (Field Effect Transistor) can be reduced with a simple circuit configuration.

A coil constitutes a resonance circuit together with an input capacitance at a gate of the FET. A switch (regeneration switch) turns on or off current flowing in the coil. A DC power source is a power source to replenish the resonance circuit with electric charge and is connected to the gate of the FET. A switch (replenish switch) turns on or off connection between the DC power source and the gate of the FET. The present technology is applicable to, for example, a power source that outputs AC voltage and current by switching operation.

11 Claims, 22 Drawing Sheets

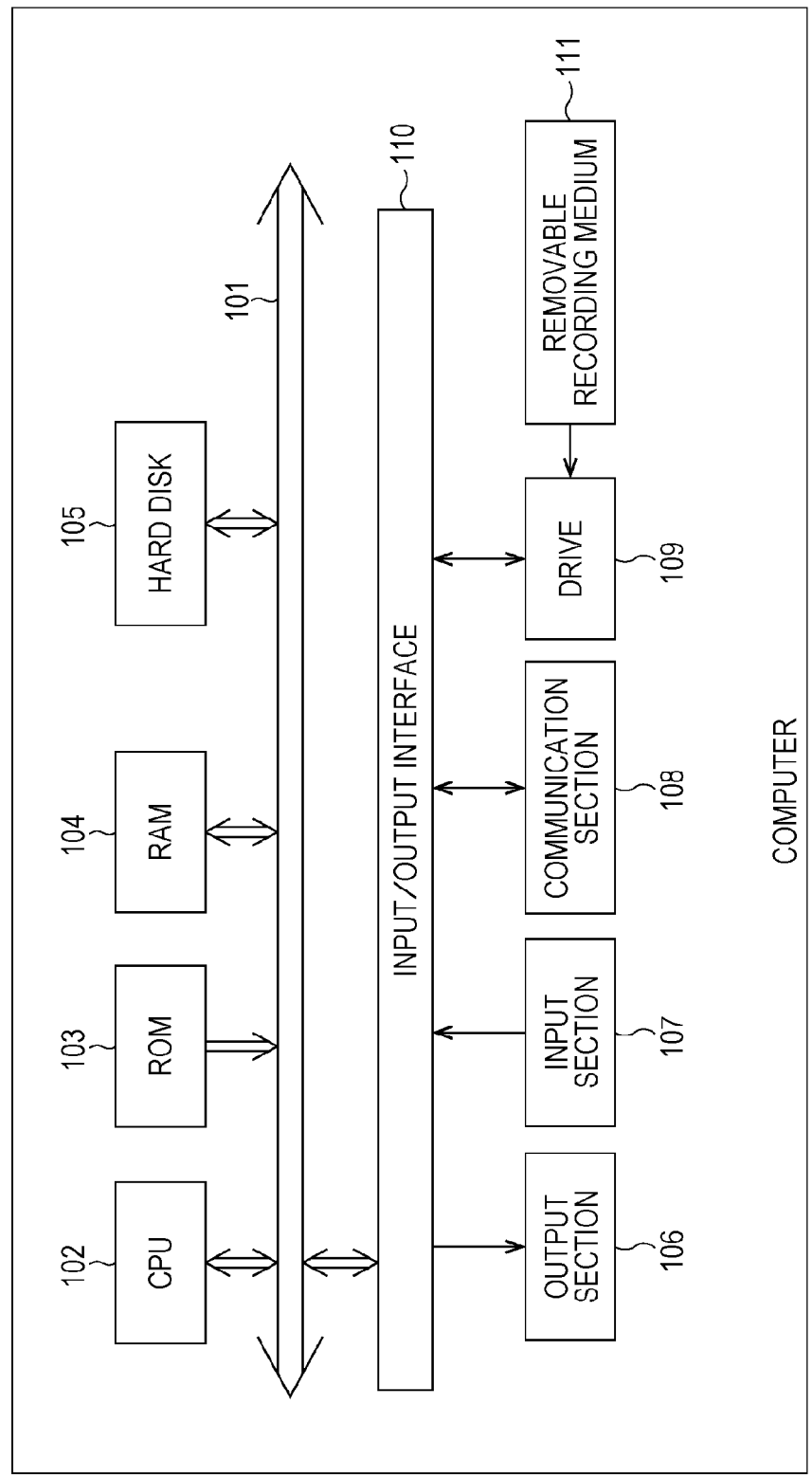

DRIVING CIRCUIT AND DRIVING METHOD

TECHNICAL FIELD

The present technology relates to a driving circuit and a driving method, particularly relates to the driving circuit and the driving method in which power loss at the time of switching an FET (Field Effect Transistor) can be reduced with a simple circuit configuration.

BACKGROUND ART

In recent years, attention has been given to a wireless charging system whereby power is supplied wirelessly.

In the wireless charging, required is a high frequency power source capable of outputting AC signals (voltage, current) such as sine waves having a certain level of power.

Since a signal having high-power sine waves can be hardly generated with high efficiency, an inverter configured to generate square waves by switching operation and whereby high efficiency can be achieved with a simple circuit configuration is generally used as a high frequency power source.

In the inverter, a power MOS FET (Metal Oxide Semiconductor FET) is used as a switch element to execute switching operation, for example.

FIG. 1 is a diagram illustrating an exemplary configuration of a section configured to execute switching of an inverter in a related art.

In FIG. 1, an FET 1 has a source grounded (connected to a ground wire) and a drain connected to a terminal or a line, not illustrated, configured to switch (turn on/off) the connection with the ground wire.

Further, the FET 1 has a gate configured to be supplied with a pulse (gate pulse) output from a pulse output section 2, and the FET 1 (gate) is driven by the pulse output from the pulse output section 2.

More specifically, the FET 1 is the FET of an nMOS (negative channel MOS), and configured to be turned on when the pulse of a level H (High) is applied to the gate and to be turned off when the pulse of a level L (Low) is applied (when the pulse of the level H is not applied).

Therefore, the FET 1 performs switching operation whereby the FET 1 is turned on when the pulse output from the pulse output section 2 is the level H (High) and is turned off when the same pulse is the level L (Low).

Meanwhile, the FET 1 is needed to be a power MOS FET having a small resistance (on-resistance) between the drain and the source in order to improve efficiency of the inverter.

However, it is necessary to increase a channel width of a channel of the FET 1 in order to make the on-resistance of the FET 1 small, and as trade-off thereof, input capacitance $C_{iss}$ at the gate is increased.

Therefore, input resistance at the gate of the FET 1 is large, but the input capacitance $C_{iss}$ is also large. Accordingly, the FET 1 is to be a heavy capacitive load for the pulse output section 2 (driver) that outputs pulse to drive the FET 1 that has such a large input capacitance $C_{iss}$.

More specifically, when the FET 1 is turned on, a large amount of electric charge is required to charge the large input capacitance $C_{iss}$ and heavy current flows. Further, when the FET 1 is turned off, a large amount of the electric charge that has been charged to the input capacitance $C_{iss}$ is discharged, and heavy current flows.

Therefore, at the time of switching the FET 1, a phenomenon equivalent to filling a glass with electric charge and discharging the electric charge from the glass occurs as illustrated in FIG. 1, and a large amount of power is lost.

Such power loss at the time of switching becomes more obvious in the case of executing switching at a high speed.

Considering this, proposed is a gate driving circuit of power MOS FET in Patent Document 1, for example, whereby power loss is reduced by flowing current in a coil to accumulate energy and regenerating the energy.

CITATION LIST

Patent Document

Patent Document 1: Japanese Patent Application Laid-Open No. 2006-054954

SUMMARY OF THE INVENTION

Problems to be Solved by the Invention

Recently, a technology that can reduce power loss at the time of switching an FET with a more simple circuit is requested to be proposed.

The present technology is made in view of such a situation and achieves to reduce power loss at the time of switching the FET with a simple circuit.

Solutions to Problems

A driving circuit according to an aspect of the present technology is a driving circuit for an FET (Field Effect Transistor) including: a coil constituting a resonance circuit together with an input capacitance at a gate of the FET; a first switch configured to turn on or off current flowing in the coil; a DC power source connected to the gate of the FET in order to replenish the resonance circuit with electric charge; and a second switch configured to turn on or off connection between the DC power source and the gate of the FET.

In the above-described driving circuit, current flowing in the coil that constitutes the resonance circuit together with the input capacitance at the gate of the FET is turned on or off. Further, a DC power source to replenish the resonance circuit with electric charge is connected to the gate of the FET, and this connection is turned on or off.

A driving method according to an aspect of the present technology is a driving method for a driving circuit for an FET (Field Effect Transistor) that includes: a coil constituting a resonance circuit together with an input capacitance at a gate of the FET; a first switch configured to turn on or off current flowing in the coil; a DC power source connected to the gate of the FET in order to replenish the resonance circuit with electric charge; and a second switch configured to turn on or off connection between the DC power source and the gate of the FET, the method including: temporarily turning on the first switch of the driving circuit in a cycle corresponding to a cycle of switching the FET; and periodically turning on the second switch only for a predetermined period within a period during which the first switch is turned off.

According to the above-described driving method, the first switch that turns on or off current flowing in the coil which constitutes the resonance circuit together with the input capacitance at the gate of FET is temporarily turned on in the cycle corresponding to the cycle of switching the FET. Further, the second switch that turns on or off the connection between the gate of the FET and the DC power source to replenish the resonance circuit with electric charge is periodically turned on only for the predetermined period within the period during which the first switch is turned off.

Note that the driving circuit may be an independent device or may be an internal block constituting one device.

Effects of the Invention

According to an aspect of the present technology, power loss at the time of switching the FET can be reduced with a simple circuit.

BRIEF DESCRIPTION OF DRAWINGS

FIG. 22 is a block diagram illustrating an exemplary configuration of an embodiment of a computer to which the present technology is applied.

MODE FOR CARRYING OUT THE INVENTION

[Embodiment of Wireless Charging System to which Present Technology is Applied]

Figure 1:
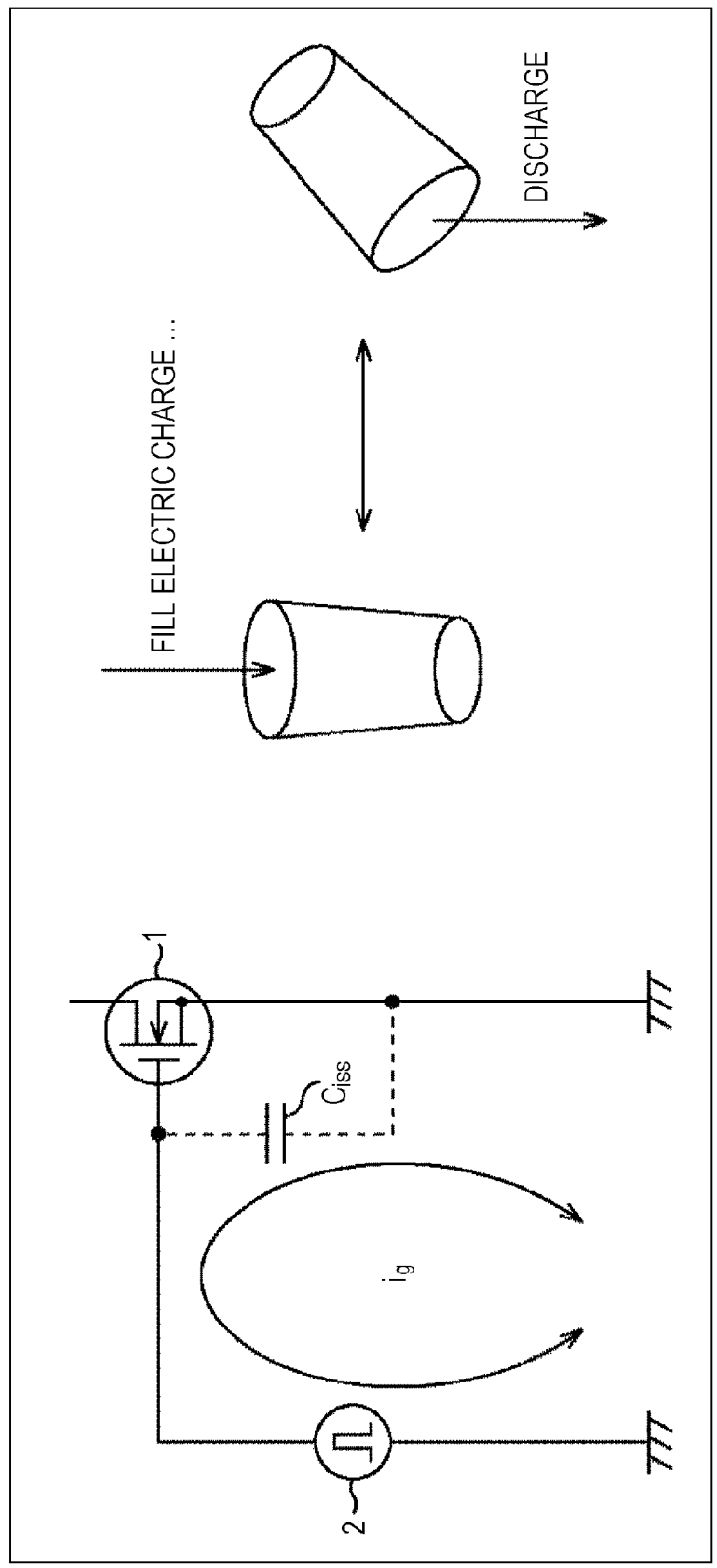
FIG. 1 is a diagram illustrating an exemplary configuration of a section that executes switching of an inverter in a related art.
Figure 2:
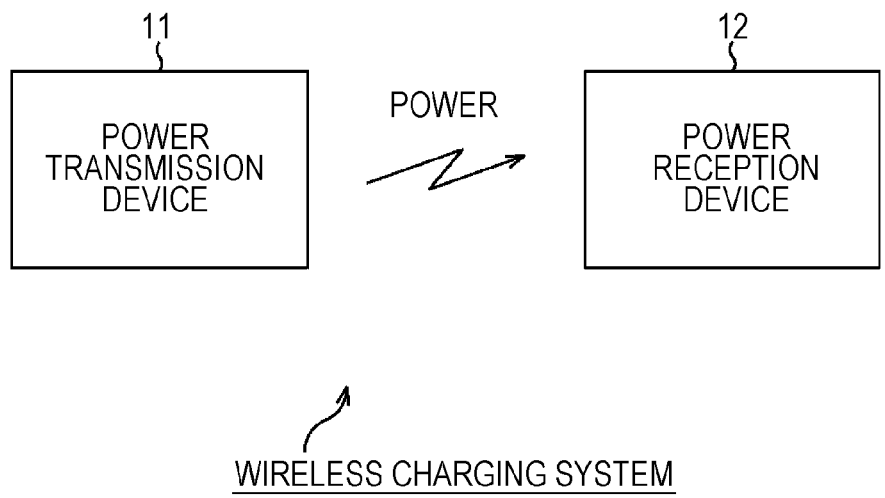
FIG. 2 is a block diagram illustrating an exemplary configuration of an embodiment of a wireless charging system to which the present technology is applied.

FIG. 2 is a block diagram illustrating an exemplary configuration of an embodiment of a wireless charging system to which the present technology is applied.

In FIG. 2, the wireless charging system includes a power transmission device 11 and a power reception device 12, and executes wireless charging by, for example, a magnetic field resonance system, an electromagnetic induction system or the like, utilizing a magnetic field.

The power transmission device 11 includes a power transmission coil which is a coil to transmit power by utilizing the magnetic field, and transmits power.

The power reception device 12 includes a power reception coil which is a coil to receive power by utilizing the magnetic field, and receives the power transmitted from the power transmission device 11 in the case of being placed near the power transmission device 11.

Here, a system to which the wireless charging system in FIG. 2 is applied may be, for example, a set of a cradle as the power transmission device 11 and a portable terminal such as cell phone as the power reception device 12, or for example, a set of a plug-in station as the power transmission device 11 and a battery car as the power reception device 12, or for example, a set of a TV rack as the power transmission device 11 and a TV (television receiver) as the power reception device 12, and so on.

Further, in FIG. 2, only one power reception device 12 is illustrated as the power reception device receiving the power from one power transmission device 11 by wireless charging, but the number of the power reception devices to receive the power by the wireless charging may be plural.

According to the wireless charging system including a plurality of power reception devices, for example, a plurality of portable terminals can be simultaneously charged by disposing a plurality of portable terminals as the power reception device on a tray (charge tray) as the power transmission device 11, for example.

[Exemplary Configuration of Power Transmission Device 11]

Figure 3:
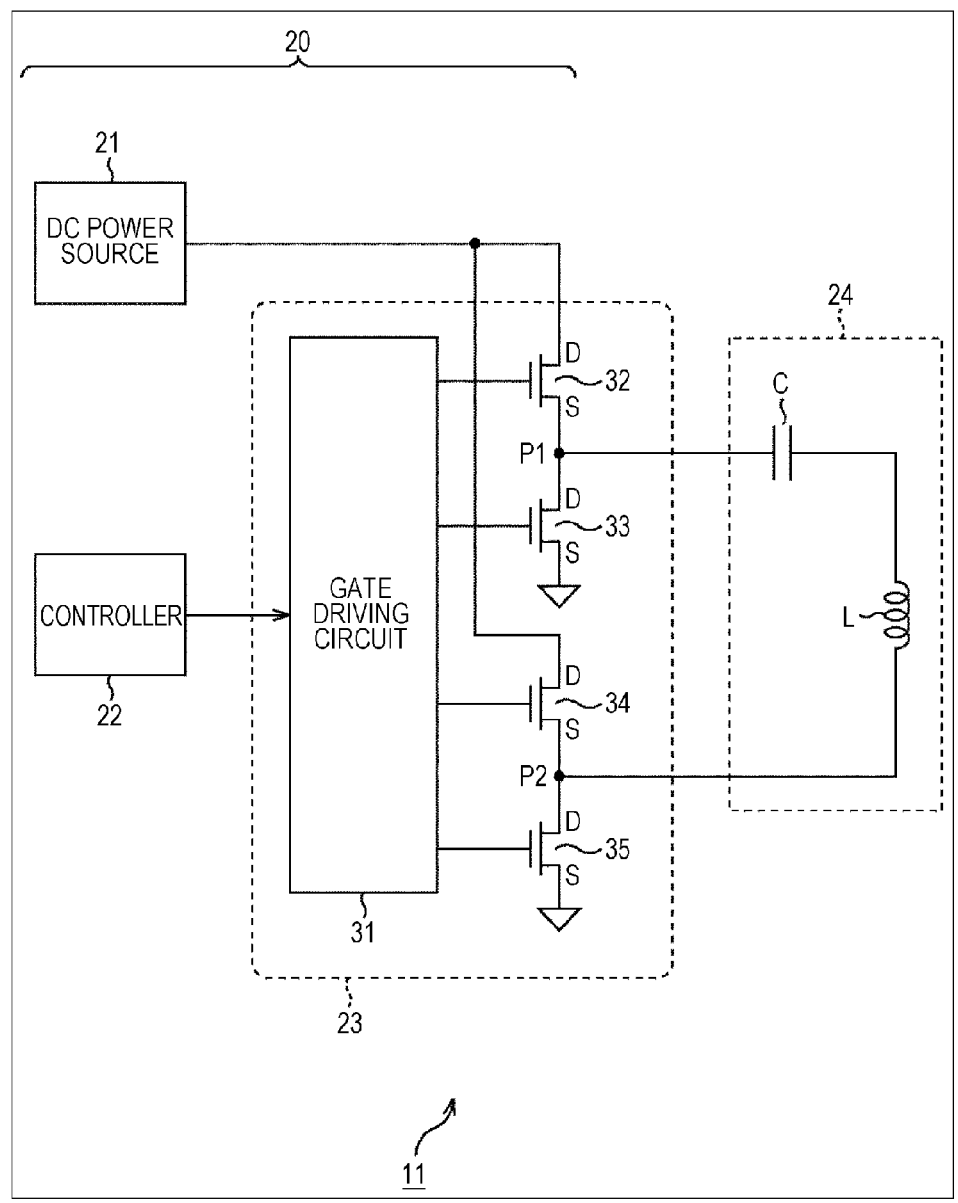
FIG. 3 is a block diagram illustrating an exemplary configuration of a power transmission device 11.

FIG. 3 is a block diagram illustrating an exemplary configuration of a power transmission device 11 in FIG. 2.

In FIG. 3, the power transmission device 11 includes a high frequency power source 20 and a resonance circuit 24, and functions as a power source configured to execute wireless charging.

The high frequency power source 20 includes a DC power source 21, a controller 22, and a driver circuit 23, and functions as the power source that outputs voltage and current having square waves as AC by switching operation.

The DC power source 21 supplies predetermined DC voltage (current) to the driver circuit 23.

The controller 22 controls the driver circuit 23 (gate driving circuit 31 thereof) and the respective blocks constituting power transmission device 11.

The driver circuit (inverter) 23 drives the resonance circuit 24 by using DC voltage from the DC power source 21, and generates a magnetic flux in a power transmission coil L constituting the resonance circuit 24, thereby transmitting power by means of the electromagnetic induction system or the magnetic field resonance system.

The resonance circuit 24 is a series resonance circuit formed of the power transmission coil L and a capacitor C, and is driven by the driver circuit 23. The magnetic flux (magnetic field) is generated at the power transmission coil L by driving the resonance circuit 24, and wireless charging whereby the power is transmitted to the power reception device 12 by the electromagnetic induction system or the magnetic field resonance system is executed by the magnetic flux.

Here, in FIG. 3, the driver circuit 23 constitutes a full-bridge inverter and includes a gate driving circuit 31 and NMOS FETs 32, 33, 34, and 35.

The gate driving circuit 31 turns on or off (on/off) the respective FETs 32 to 35 by applying predetermined voltage to gates of the FETs 32 to 35 in accordance with control of the controller 22.

The FETs 32 to 35 are power MOS FETs and configured to be turned on or off (on/off) in accordance with drive of the gate driving circuit 31.

The FET 32 has a drain connected to the DC power source 21, and therefore, the predetermined DC voltage output from the DC power source 21 is applied to the drain of the FET 32.

The FET 32 has a source connected to a drain of the FET 33, and the FET 33 has a source grounded (connected to the ground wire (GND)).

The FETs 34 and 35 are connected in the same manner as the FETs 32 and 33.

More specifically, the FET 34 has a drain connected to the DC power source 21, and the FET 34 has a source connected to a drain of the FET 35. Further, the FET 35 has a source grounded.

Further, a connection point P1 of the source of the FET 32 and the drain of the FET 33 is connected to one end of the resonance circuit 24, and a connection point P2 of the source of the FET 34 and the drain of the FET 35 is connected to the other end of the resonance circuit 24.

Here, in FIG. 3, one end of the power transmission coil L and one end of the capacitor C are connected each other in the resonance circuit 24. Further, the other end of the capacitor C is connected to the connection point P1 of the source of the FET 32 and the drain of the FET 33, and the other end of the power transmission coil L is connected to the connection point P2 of the source of the FET 34 and the drain of the FET 35.

In the driver circuit 23 thus configured, the gate driving circuit 31 applies the predetermined voltage to the gates of the FETs 32 to 35 at a predetermined timing in accordance with control of the controller 22, thereby controlling the respective FETs 32 to 35 to be turned on or off.

In this manner, the respective FETs 32 and 33 are complementarily and periodically turned on and off.

In other words, the FET 32 is turned on and off periodically and alternately.

Accordingly, when the FET 32 is turned on, the FET 33 is turned off, and when the FET 32 is turned off, the FET 33 is turned on.

Also, a set of the FETs 34 and 35 are complementarily and periodically turned on and off with respect to a set of the FETs 32 and 33.

More specifically, when the FET 32 is turned on and the FET 33 is turned off, the FET 34 is turned off and the FET 35 is turned on.

Further, when the FET 32 is turned off and the FET 33 is turned on, the FET 34 is turned on and the FET 35 is turned off.

For example, focusing on the FET 32 now, when the FET 32 is turned on, the FET 33 is turned off, the FET 34 is turned off, and the FET 35 is turned on.

As a result, the connection point P1 of the source of the FET 32 and the drain of the FET 33 becomes, for example, a level H (High) which is the predetermined DC voltage output level from the DC power source 21, and the connection point P2 of the source of the FET 34 and the drain of the FET 35 becomes, for example, a level L (Low) which is a level of the ground wire.

Therefore, in the resonance circuit 24, current flows in a direction from the connection point P1 toward the connection point P2 via the capacitor C and the power transmission coil L.

On the other hand, when the FET 32 is turned off, the FET 33 is turned on, the FET 34 is turned on, and the FET 35 is turned off.

As a result, the connection point P2 of the source of the FET 34 and the drain of the FET 35 becomes the level H (High) which is the predetermined DC voltage output from the DC power source 21, and the connection point P1 of the source of the FET 32 and the drain of the FET 33 becomes the level L (Low) which is a level of the ground wire.

Therefore, in the resonance circuit 24, current flows in a direction from the connection point P2 to the connection point P1 via the power transmission coil L and the capacitor C.

As described above, periodic AC voltage (square wave voltage) by which the FETs 32 to 35 are turned on (or off) is applied to the resonance circuit 24, and same periodic AC current flows in accordance with the AC voltage application.

The AC current flows in the resonance circuit 24, thereby continuously generating a magnetic flux in the power transmission coil L constituting the resonance circuit 24, and power is transmitted by the magnetic flux.

Meanwhile, a cycle in which the FETs 32 to 35 are turned on (or off) is set to a resonance cycle $2\pi\sqrt{(LC)}$ of the resonance circuit 24 including the power transmission coil L and the capacitor C, more specifically, the cycle is set to an inverse number of the resonance frequency $1/(2\pi\sqrt{(LC)})$ of the resonance circuit 24.

Additionally, the full-bridge inverter is adopted as the driver circuit 23 in FIG. 3, but other circuits, such as a half-bridge inverter, configured to execute switching (on/off) of the FETs may be adopted as the driver circuit 23.

[First Exemplary Configuration of Gate Driving Circuit 31]

Figure 4:
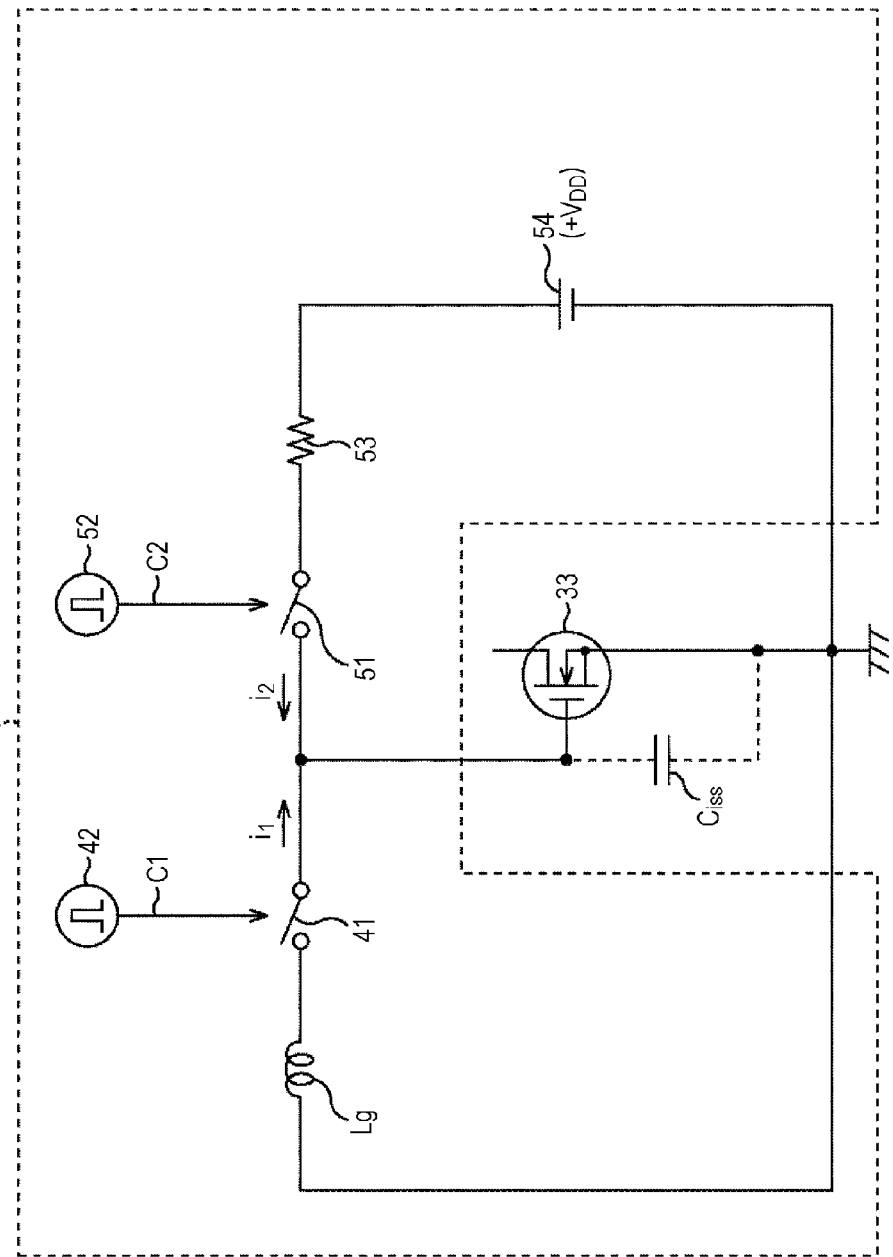
FIG. 4 is a circuit diagram illustrating a first exemplary configuration of a gate driving circuit 31.

FIG. 4 is a circuit diagram illustrating a first exemplary configuration of a gate driving circuit 31 in FIG. 3.

Note that FIG. 4 is a diagram illustrating an exemplary configuration of a section included in the gate driving circuit 31 of FIG. 3 and configured to drive the FET 33, for example. The driving sections configured to drive the respective FETs 32, 34, 35 other than the FET 33 are also configured in the same manner.

The gate driving circuit 31 has a power regeneration mechanism to regenerate power that has been used to drive the FET in order to drive, with high efficiency, the power MOS FET (gate thereof) which is a capacitive load.

More specifically, in FIG. 4, the gate driving circuit 31 includes a coil (regeneration coil) $L_g$, a switch (regeneration switch) 41, a controller 42, a switch (replenish switch) 51, a controller 52, a resistance (current-limiting resistance) 53, and a DC power source 54.

One end of the coil $L_g$ is connected to the gate of the FET 33 via the switch 41, and the other end of the coil $L_g$ is connected to the source of the FET 33 (which is also the ground wire in FIG. 4). Therefore, the coil $L_g$ constitutes the (series) resonance circuit together with an input capacitance (capacitor) $C_{iss}$ at the gate of the FET 33.

The switch 41 (first switch) is disposed between one end of the coil $L_g$ and the gate of the FET 33. The switch 41 is turned on or off in accordance with control from the controller 42, namely a control signal C1 supplied from the controller 42, thereby turning on or off current $i_1$ flowing in the coil $L_g$.

Here, according to the present embodiment, as for the current $i_1$ flowing in the coil $L_g$, a flowing direction from the coil $L_g$ to the gate of the FET 33 is set as a positive direction, and a direction opposite thereto is set as a negative direction.

The controller 42 controls the switch 41 (on/off thereof) by supplying the control signal (regeneration switch control signal) C1 to the switch 41.

The switch 51 (second switch) is turned on or off in accordance with control from the controller 52, namely, a control signal (replenish switch control signal) C2 supplied from the controller 52, thereby turning on or off connection between the DC power source 54 and the gate of the FET 33.

More specifically, a plus terminal of the DC power source 54 is connected to the gate of the FET 33 via the resistance 53 and the switch 51, and a minus terminal of the DC power source 54 is connected to the source of the FET 33.

Therefore, connection between the DC power source 54 (plus terminal thereof) and the gate of the FET 33 is turned on or off by turning on or off the switch 51.

The controller 52 controls the switch 51 (on/off thereof) by supplying the control signal C2 to the switch 51.

The resistance 53 is a resistance to limit current $i_2$ flowing from the DC power source 54 when the switch 51 is turned on, and one end of the resistance 53 is connected to the plus terminal of the DC power source 54 and the other end of the resistance 53 is connected to the gate of the FET 33 via the switch 51.

Here, according to the present embodiment, as for the current (current flowing at the resistance 53) $i_2$ flowing from the DC power source 54, a flowing direction from the plus terminal of the DC power source 54 to the gate of the FET 33 is set as a positive direction, and a direction opposite thereto is set as a negative direction.

The DC power source 54 is a power source configured to output predetermined DC voltage $+V_{DD}$ (>0). The plus terminal of the DC power source 54 is connected to the gate of the FET 33 via the resistance 53 and the switch 51, and the minus terminal of the DC power source 54 is connected to the source of the FET 33. Therefore, (DC) voltage $+V_{DD}$ of the DC power source 54 is applied to the gate of the FET 33 by turning on the switch 51.

Note that the voltage $+V_{DD}$ of the DC power source 54 is enough voltage to drive the FET 33 (voltage larger than voltage $v_{gs}$ between the gate and the source when the FET 33 is turned on).

Further, the input capacitance $C_{iss}$ at the gate of the FET 33 exists in parallel between the gate and source of the FET 33 equivalently.

In the gate driving circuit 31 thus configured, the input capacitance $C_{iss}$ at the gate of the FET 33, coil $L_g$, switch 41, and controller 42 constitute a power regeneration mechanism configured to regenerate power used to drive the FET 33.

More specifically, when the FET 33 is turned on now, for example, electric charge is accumulated in the input capacitance $C_{iss}$ at the gate of the FET 33, and the voltage at the gate (gate voltage viewed from the source) becomes the level H.

Further, when the switches 41 and 51 are turned off, the electric charge accumulated in the input capacitance $C_{iss}$ is not discharged and the voltage at the gate is kept at the level H, thereby keeping the FET 33 turned on.

Note that the voltage at the gate of the FET 33 at this point, more specifically, the voltage at the terminal of the input capacitance $C_{iss}$ connected to the gate based on the terminal connected to the source, is voltage $+V_{DD}$ of the DC power source 54, for example.

The switch 41 is turned on at the timing when the FET 33 is to be turned off (to be switched) in accordance with control of the controller 42.

By turning on the switch 41, the electric charge accumulated in the input capacitance $C_{iss}$ is discharged via the switch 41 and the coil $L_g$, and the current $i_1$ corresponding to the discharged electric charge flows in the coil $L_g$ in the negative direction.

The current $i_1$ flows in the coil $L_g$, thereby accumulating electric energy (magnetic energy) corresponding to the current $i_1$ in the coil $L_g$.

When electric charge accumulated in the input capacitance $C_{iss}$ is discharged to some extent, and the gate voltage lowers from the voltage $+V_{DD}$ to a value less than a predetermined value (gate voltage that turns on the FET 33), the FET 33 is turned off.

Then, when all the electric charge accumulated in the input capacitance $C_{iss}$ is discharged, the current $i_1$ flowing in the coil $L_g$ tries to become zero, but the current $i_1$ continuously flows in the coil $L_g$ in the negative direction due to inertia.

The electric charge is accumulated in the input capacitance $C_{iss}$ by the current $i_1$ continuously flowing in the coil $L_g$. When polarity of the voltage at the gate of the FET 33 (voltage of the terminal of the input capacitance $C_{iss}$ connected to the gate based on the terminal connected to the source) is inverted, more specifically, when the voltage at the gate of the FET 33 becomes voltage $-V_{DD}$, the current $i_1$ flowing in the coil $L_g$ becomes zero.

The switch 41 is turned off at the timing when the current $i_1$ flowing in the coil $L_g$ becomes zero in accordance with control of the controller 42. The voltage at the gate of the FET 33 is kept at the voltage $-V_{DD}$ by this.

After that, the switch 41 is turned on at timing when the FET 33 is to be turned on (to be switched) in accordance with control of the controller 42.

By turning on the switch 41, the electric charge accumulated in the input capacitance $C_{iss}$ is discharged via the coil $L_g$ and the switch 41, and the current $i_1$ corresponding to the discharged electric charge flows in the coil $L_g$ in the positive direction.

The current $i_1$ flows in the coil $L_g$, thereby accumulating the electric energy (magnetic energy) corresponding to the current $i_1$ in the coil $L_g$.

When the electric charge accumulated in the input capacitance $C_{iss}$ is discharged to some extent and the voltage at the gate rises higher than the predetermined value from the voltage $-V_{DD}$, the FET 33 is turned on.

Then, when all of the electric charge accumulated in the input capacitance $C_{iss}$ is discharged, the current $i_1$ flowing in the coil $L_g$ tries to become zero, but the current $i_1$ continuously flows in the coil $L_g$ in the positive direction due to inertia.

The current $i_1$ continuously flows in the coil $L_g$, thereby accumulating the electric charge in the input capacitance $C_{iss}$. When polarity of the voltage at the gate of the FET 33 is inverted, more specifically, when the voltage at the gate of the FET 33 becomes voltage $+V_{DD}$, the current $i_1$ flowing in the coil $L_g$ becomes zero.

The switch 41 is turned off at the timing when the current $i_1$ flowing in the coil $L_g$ becomes zero in accordance with control of the controller 42. The voltage at the gate of the FET 33 is kept at the voltage $+V_{DD}$ by this.

After that, the switch 41 is turned on the timing when the FET 33 is to be turned off in accordance with control of the controller 42, and the same operation is repeated afterward.

As described above, in the input capacitance $C_{iss}$, coil $L_g$, switch 41, and controller 42 as the power regeneration mechanism, the electric energy (electric charge) accumulated in the input capacitance $C_{iss}$ is accumulated in the coil $L_g$ constituting the resonance circuit together with the input capacitance $C_{iss}$, and the electric energy accumulated in the coil $L_g$ is repeatedly accumulated in the input capacitance $C_{iss}$, thereby regenerating the power that has been used to drive the FET 33. The regenerated power is used again to drive the FET 33.

Note that power cannot be permanently regenerated (power regeneration cannot be permanently executed) in the above-described power regeneration mechanism because the power is partly lost as heat and the like.

For this reason, lost power is suitably replenished in the gate driving circuit 31.

More specifically, the switch 51 is periodically and temporarily turned on (from off to on) in accordance with control of the controller 52, for example.

When the switch 51 is turned on, the current $i_2$ flows from the DC power source 54 to the input capacitance $C_{iss}$ via the resistance 53, switch 51, and gate of the FET 33, power (electric charge) is replenished in the resonance circuit including the input capacitance $C_{iss}$ and the coil $L_g$. Therefore, the DC power source 54 can be called as a power source to replenish electric charge (power), and the current $i_2$ flowing from the DC power source 54 can be called as replenish current to replenish the electric charge (power).

[Operation in First Exemplary Configuration of Gate Driving Circuit 31]

Figure 5:
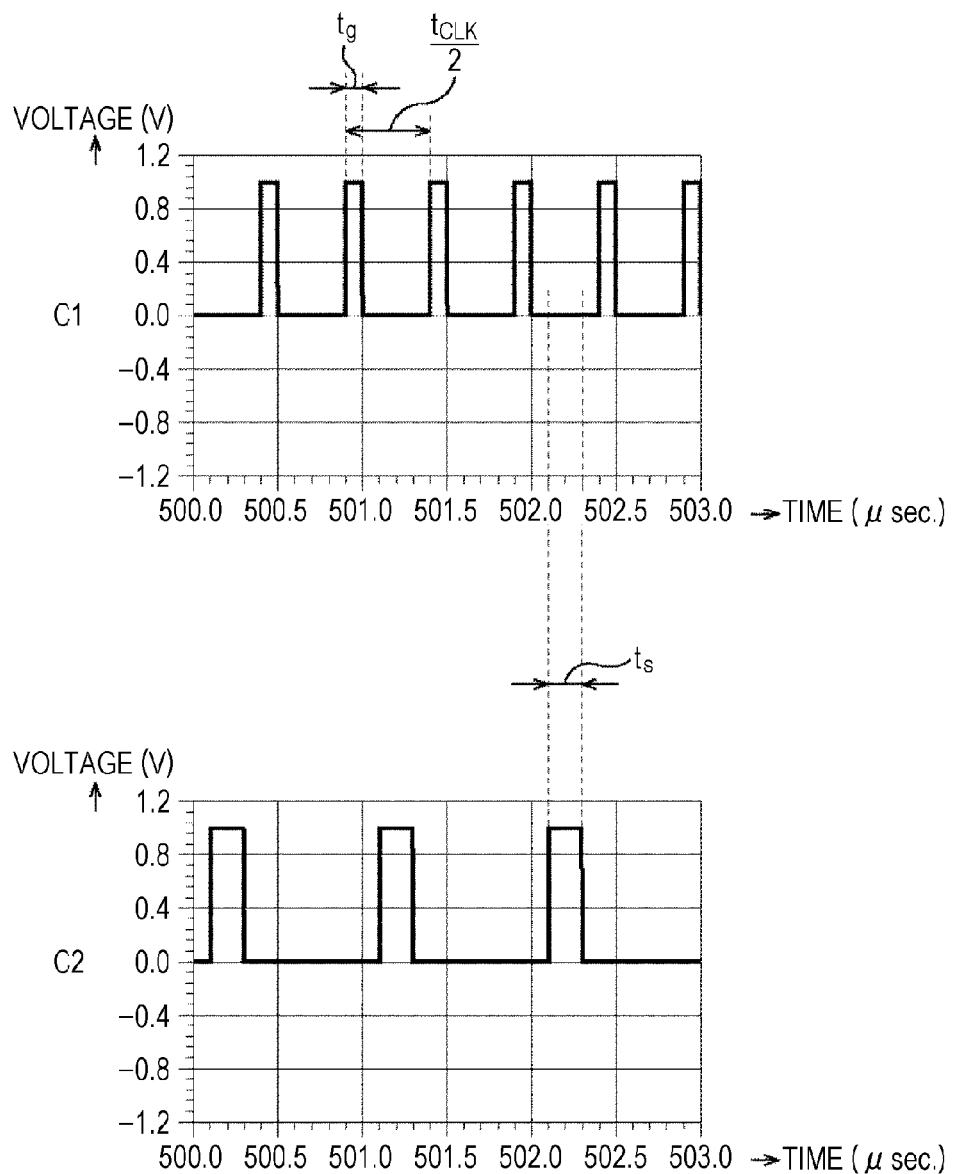
FIG. 5 is a waveform chart illustrating a control signal C1 output from a controller 42 and a control signal C2 output from a controller 52.

FIG. 5 is a waveform chart illustrating the control signal C1 output from the controller 42 and the control signal C2 output from the controller 52 in FIG. 4.

Note that the control signals C1 and C2 are pulse signals which have two values of level L and level H.

When the control signal C1 is the level L, the switch 41 is turned off, and when the control signal C1 is the level H, the switch 41 is turned on.

In the same manner, when the control signal C2 is the level L, the switch 51 is turned off, and when the control signal C2 is the level H, the switch 51 is turned on.

Therefore, the waveforms of the control signals C1 and C2 respectively represent on/off states of the switches 41 and 51 as well, and in the following, a description will be suitably given provided that the waveforms of the control signals C1 and C2 respectively represent the on/off states of the switches 41 and 51.

As illustrated in FIG. 5, the controller 42 becomes the level H (temporarily) only for a period $t_g=\pi\sqrt{(L_g C_{iss})}$ which is ½ of a resonance cycle $2\pi\sqrt{(L_g C_{iss})}$ (the inverse number of a resonance frequency $1/(2\pi\sqrt{(L_g C_{iss})})$ at a $L_g C_{iss}$ resonance circuit) of the resonance circuit including the coil $L_g$ and the input capacitance $C_{iss}$ (hereinafter referred to as $L_g C_{iss}$ resonance circuit), for example, in a cycle $t_{CLK}/2$ which is ½ of a cycle $t_{CLK}$ as a cycle corresponding to the switching cycle $t_{CLK}$ of the FET 33, and the controller 42 supplies a signal to be the level L to the switch 41 as the control signal C1 during other periods (time).

Therefore, the switch 41 is (temporarily) turned on only for a period $t_g$ in the cycle $t_{CLK}/2$ (and is turned off during other periods (time)).

As illustrated in FIG. 5, the controller 52 periodically becomes the level H for a period during which the switch 41 is turned off, more specifically, only for a period $t_s$ as a predetermined period within a period during which the control signal C1 is the level L, and supplies the signal to be the level L to the switch 51 as the control signal C2 during other periods.

Therefore, the switch 51 is periodically (temporarily) turned on only for the period $t_s$ within the period during which the switch 41 is turned off (and the switch 51 is turned off during other periods).

Figure 6:
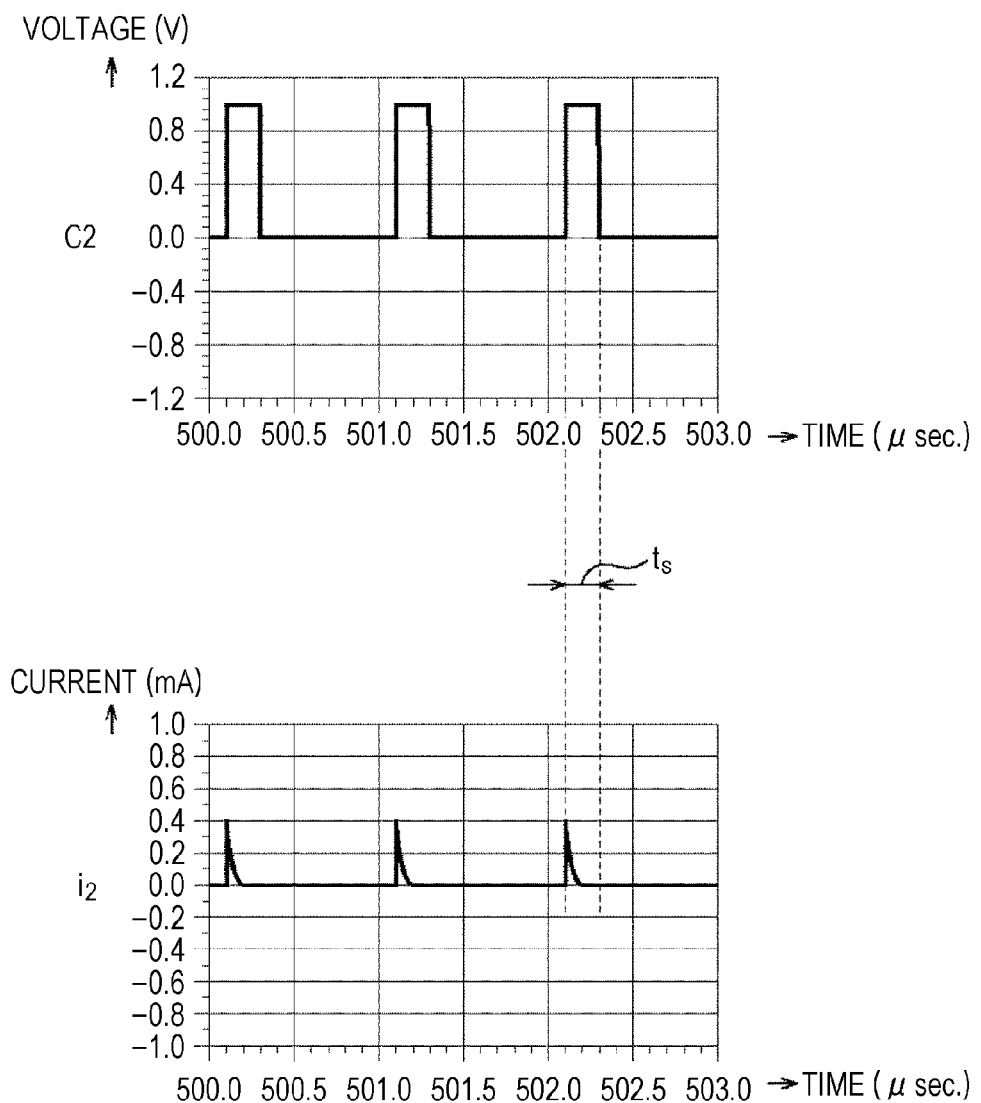
FIG. 6 is a waveform chart illustrating the control signal C2 and current $i_2$ that flows by a switch 51 being controlled in accordance with the control signal C2.

FIG. 6 is a waveform chart illustrating the control signal C2 and current $i_2$ (replenish current) flowing by the switch 51 being controlled in accordance with the control signal C2.

When the control signal C2 becomes the level H and the switch 51 is turned on, the current $i_2$ flows from the DC power source 54.

As described in FIG. 5, the switch 51 is turned on only for the period $t_s$, but since the switch 51 is turned on only for the period during which the switch 41 is turned off, the current $i_2$ (electric charge) flowing from the DC power source 54 flows into the input capacitance $C_{iss}$ at the gate of the FET 33 via the resistance 53 and the switch 51 which is being turned on.

Therefore, at a moment when the switch 51 is turned on, electric charge is instantly accumulated in the input capacitance $C_{iss}$ at the gate of the FET 33 by the current $i_2$ flowing from the DC power source 54, and then, the electric charge accumulated in the input capacitance $C_{iss}$ is rapidly reduced.

As a result, as illustrated in FIG. 6, a large amount of the current $i_2$ flows at the moment when the switch 51 is turned on, and the amount of the current $i_2$ is rapidly reduced afterward. A reducing speed (time) of current $i_2$ is determined by a time constant acquired based on the resistance 53 and the input capacitance $C_{iss}$.

In FIGS. 5 and 6, the switch 51 is turned on once every two cycles in which the switch 41 is turned on, and electric charge is accumulated (replenished) in the input capacitance $C_{iss}$ of the $L_g C_{iss}$ resonance circuit including the input capacitance $C_{iss}$ and the coil $L_g$.

Here, note that a rate at which the switch 51 is turned on is not limited to once every two cycles in which the switch 41 is turned on.

Figure 7:
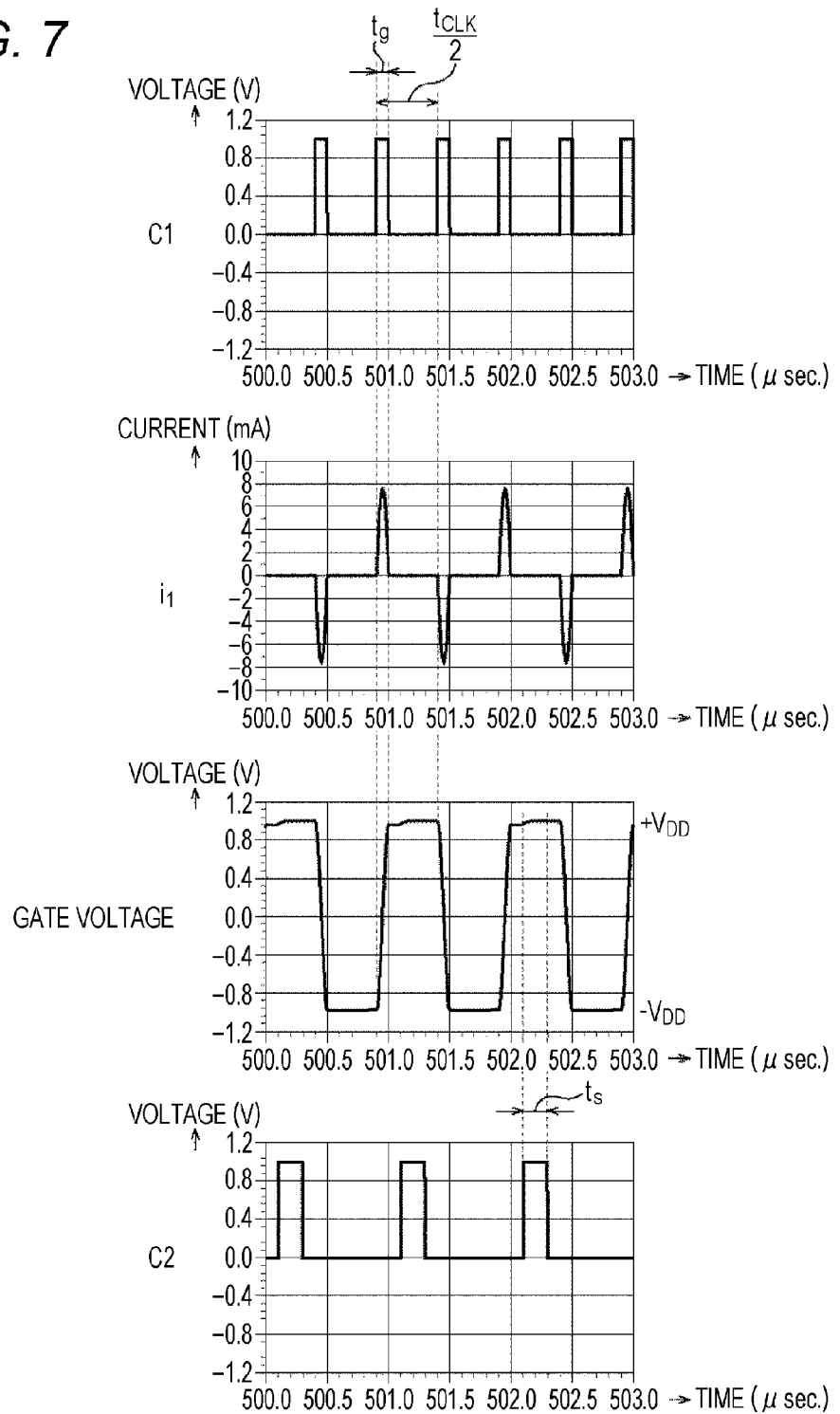
FIG. 7 is a waveform chart illustrating control signal C1, current $i_1$ that flows by a switch 41 being controlled in accordance with the control signal C1, and gate voltage.

FIG. 7 is a waveform chart illustrating control signal C1, the current (regeneration current) $i_1$ that flows by the switch 41 being controlled in accordance with the control signal C1, and the gate voltage (voltage at the gate of the FET 33).

Note that the control signal C2 (on/off of the switch 52) illustrated in FIG. 6 is also illustrated in FIG. 7 for reference in addition to the control signal C1 (on/off of the switch 41), current $i_1$ and gate voltage.

As illustrated in FIG. 5, the switch 41 (control signal C1) is turned on only for the period $t_g$ in the cycle $t_{CLK}/2$.

Here, note that the switch 51 is turned off for the period $t_g$ during which the switch 41 is turned on because the switch 51 is turned on for the period during which the switch 41 is turned off as described in FIG. 5.

Therefore, in the case where the switch 41 is turned on, only the $L_g C_{iss}$ resonance circuit including the input capacitance $C_{iss}$ and the coil $L_g$ becomes a conductive state via the switch 41 which is turned on (the coil $L_g$ and input capacitance $C_{iss}$ do not become conductive with the resistance 53 and DC power source 54).

For example, in the case where the switch 41 is turned on now under the condition that electric charge is accumulated in the input capacitance $C_{iss}$ such that the gate voltage becomes positive voltage $+V_{DD}$, the electric charge accumulated in the input capacitance $C_{iss}$ sequentially flows from the input capacitance $C_{iss}$ to the switch 41 and the coil $L_g$, thereby causing the current $i_1$ to flow in the $L_g C_{iss}$ resonance circuit in the negative direction as illustrated in FIG. 7.

The current $i_1$ flows in the negative direction only for the period $t_g$ during which the switch 41 is turned on, thereby accumulating electric charge in the input capacitance $C_{iss}$ such that the gate voltage becomes (substantially) the negative voltage $-V_{DD}$.

After that, the switch 41 is turned on again only for the period $t_g$, the electric charge being accumulated in the input capacitance $C_{iss}$ such that the gate voltage becomes the negative voltage $-V_{DD}$ flows sequentially from the input capacitance $C_{iss}$ to the coil $L_g$ and switch 41, thereby causing the current $i_1$ to flow in the $L_g C_{iss}$ resonance circuit in the positive direction as illustrated in FIG. 7.

The current $i_1$ flows in the positive direction only for the period $t_g$ during which the switch 41 is turned on, thereby accumulating electric charge in the input capacitance $C_{iss}$ such that the gate voltage becomes (substantially) the positive voltage $+V_{DD}$.

Afterward, in the same manner, every time the switch 41 is turned on in the cycle $t_{CLK}/2$, the current $i_1$ alternately repeats flowing in the positive direction and flowing in the negative direction in the $L_g C_{iss}$ resonance circuit by the electric charge accumulated in the input capacitance $C_{iss}$.

As a result, the gate voltage alternately becomes the positive voltage $+V_{DD}$ (level H) and the negative voltage $-V_{DD}$ (level L) every period $t_{CLK}/2$, and the FET 33 is switched in the cycle $t_{CLK}$.

More specifically, in FIG. 7, the FET 33 is (temporarily) turned on only for the period $t_{CLK}/2$ in the cycle $t_{CLK}$ (and thereafter, the FET 33 is turned off for the period $t_{CLK}/2$).

Meanwhile, in FIG. 7, both the period during which the gate voltage is being positive voltage $+V_{DD}$ and the period during which the gate voltage is being the negative voltage $-V_{DD}$ are the same period $t_{CLK}/2$, in which the gate voltage has a pulse of a duty ratio 50%.

The duty ratio of the gate voltage can be adjusted by shifting one of two on-timings in a set that includes two consecutive timings (on-timings) when the switch 41 is turned on in the cycle $t_{CLK}/2$.

More specifically, for example, in the case where the gate voltage now becomes the positive voltage $+V_{DD}$ at a first on-timing of a certain on-timing set, a period between the first on-timing and a second on-timing is a period during which the gate voltage becomes the positive voltage $+V_{DD}$, and a period from the second on-timing and a first on-timing of a next on-timing set is a period during which the gate voltage becomes negative voltage $-V_{DD}$.

Therefore, the period during which the gate voltage becomes the positive voltage $+V_{DD}$ and the period during which the gate voltage becomes negative voltage $-V_{DD}$ can be adjusted, that is, the duty ratio of the gate voltage can be adjusted by shifting, for example, the second on-timing of the certain on-timing set.

Additionally, according to the present embodiment, the switch 51 is turned on at the rate of once every two cycles of turning on the switch 41 as described in FIGS. 5 and 6, and electric charge is replenished in the input capacitance $C_{iss}$ of the $L_g C_{iss}$ resonance circuit formed of the input capacitance $C_{iss}$ and the coil $L_g$.

According to the present embodiment, the plus terminal of the DC power source 54 is connected to the gate of the FET 33 (via the resistance 53 and the switch 51) to apply the positive voltage $+V_{DD}$. Therefore, the electric charge is replenished in the input capacitance $C_{iss}$ at the gate to which the positive voltage $+V_{DD}$ is applied, more specifically, the switch 51 (control signal C2) is turned on at the timing when the gate voltage is the positive voltage $+V_{DD}$ (level H) as illustrated in FIG. 7.

In the case where electric charge is replenished in the input capacitance $C_{iss}$ at the gate at the timing when the gate voltage is the negative voltage $-V_{DD}$ (level L), the minus terminal of the DC power source 54 is connected to the gate of the FET 33 (via the resistance 53 and the switch 51) to apply the negative voltage $-V_{DD}$ (level L).

Figure 8:
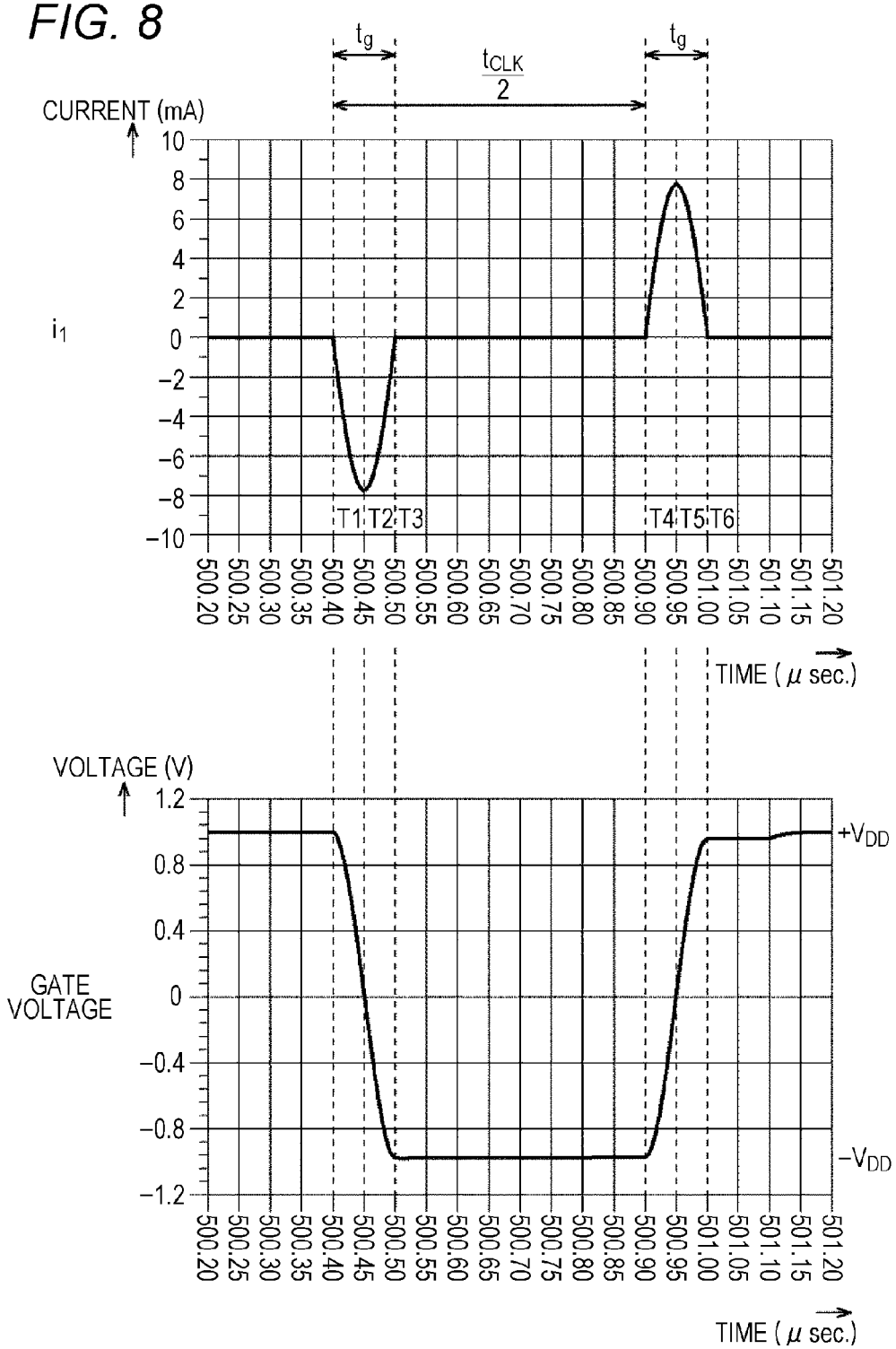
FIG. 8 is a diagram for describing a relation between the current $i_1$ and the gate voltage.

FIG. 8 is a diagram for describing a relation between the current $i_1$ and the gate voltage.

For example, it is assumed that electric charge (electric energy) is now accumulated in the input capacitance $C_{iss}$ such that gate voltage becomes the positive voltage $+V_{DD}$.

In this case, when the switch 41 is turned on, the electric charge accumulated in the input capacitance $C_{iss}$ flows (is discharged) sequentially from the input capacitance $C_{iss}$ to the switch 41 and the coil $L_g$, thereby causing the current $i_1$ to flow to the coil $L_g$ in the negative direction (period T1). The current $i_1$ is expressed by sine waves of the resonance cycle $2\pi\sqrt{(L_g C_{iss})}$ of the $L_g C_{iss}$ resonance circuit.

The electric charge is discharged from the input capacitance $C_{iss}$ (the electric charge accumulated in the input capacitance $C_{iss}$ sequentially flows from the input capacitance $C_{iss}$ to the switch 41 and the coil $L_g$), thereby lowering the gate voltage from the positive voltage $+V_{DD}$. After all of the electric charge accumulated in the input capacitance $C_{iss}$ is discharged (when a certain period $t_g/2$, which is a ¼ cycle of the resonance cycle $2\pi\sqrt{(L_g C_{iss})}$ of the $L_g C_{iss}$ resonance circuit, has passed after the switch 41 was turned on), the gate voltage becomes zero V (period T1).

At this point, the electric energy accumulated in the coil $L_g$ becomes maximum.

When all of the electric charge accumulated in the input capacitance $C_{iss}$ is discharged, the current $i_1$ flowing in the coil $L_g$ tries to become zero A, but current $i_1$ continuously flows in the coil $L_g$ in the negative direction due to inertia, more specifically, by the electric energy accumulated in the coil $L_g$ (Period T2).

The current $i_1$ continuously flows in the coil $L_g$, thereby causing the electric charge to be accumulated (charged) in the input capacitance $C_{iss}$ such that the gate voltage becomes the negative voltage (Period T2).

Then, when the ½ cycle $t_g$ of the resonance cycle $2\pi\sqrt{(L_g C_{iss})}$ of the $L_g C_{iss}$ resonance circuit has passed from the latest timing when the switch 41 was turned on, the electric energy accumulated in the coil $L_g$ becomes zero and the current $i_1$ flowing in the coil $L_g$ becomes zero A (Timing T3).

At this point, the electric charge is accumulated in the input capacitance $C_{iss}$ such that the gate voltage becomes the negative voltage $-V_{DD}$, and the $L_g C_{iss}$ resonance circuit is opened by the switch 41 being turned off, and the gate voltage is fixed at the negative voltage $-V_{DD}$ (Timing T3).

The switch 41 is turned on again when the cycle $t_{CLK}/2$ which is ½ of the cycle $t_{CLK}$ of switching the FET 33 has passed after the FET 33 was previously turned on.

When the switch 41 is turned on, the electric charge accumulated in the input capacitance $C_{iss}$ sequentially flows (is discharged) from the input capacitance $C_{iss}$ to the switch 41 and the coil $L_g$, thereby causing the current $i_1$ to flow to the coil $L_g$ in the positive direction (Period T4). The current $i_1$ is expressed by sine waves of the resonance cycle $2\pi\sqrt{(L_g C_{iss})}$ of the $L_g C_{iss}$ resonance circuit.

The electric charge is discharged from the input capacitance $C_{iss}$ (the electric charge accumulated in the input capacitance $C_{iss}$ sequentially flows from the input capacitance $C_{iss}$ to the switch 41 and the coil $L_g$), thereby raising the gate voltage from the negative voltage $-V_{DD}$. After all of the electric charge accumulated in the input capacitance $C_{iss}$ is discharged (when a specific period $t_g/2$, which is ¼ cycle of the resonance cycle $2\pi\sqrt{(L_g C_{iss})}$ of the $L_g C_{iss}$ resonance circuit, has passed after the switch 41 is turned on), the gate voltage becomes zero V (Period T4).

At this point, the electric energy accumulated in the coil $L_g$ becomes maximum again.

When all of the electric charge accumulated in the input capacitance $C_{iss}$ is discharged, the current $i_1$ flowing in the coil $L_g$ tries to become zero A, but current $i_1$ continuously flows in the coil $L_g$ in the positive direction due to inertia (Period T5).

The current $i_1$ continuously flows in the coil $L_g$, thereby causing the electric charge to be accumulated (charged) in the input capacitance $C_{iss}$ such that the gate voltage becomes the positive voltage (Period T5 ).

Then, when the ½ cycle $t_g$ of the resonance cycle $2\pi\sqrt{(L_g C_{iss})}$ of the $L_g C_{iss}$ resonance circuit has passed from the latest timing when the switch 41 was turned on, the electric energy accumulated in the coil $L_g$ becomes zero and the current $i_1$ flowing in the coil $L_g$ becomes zero A (Timing T6 ).

At this point, the electric charge is accumulated in the input capacitance $C_{iss}$ such that the gate voltage becomes the positive voltage $+V_{DD}$, and the $L_g C_{iss}$ resonance circuit is opened by the switch 41 being turned off, and the gate voltage is fixed at the positive voltage $+V_{DD}$ (Timing T3).

The switch 41 is turned on again when the cycle $t_{CLK}/2$ which is ½ of the switching cycle $t_{CLK}$ of the FET 33 has passed after the FET 33 was previously turned on. Then, the same processing is repeated afterward.

As described above, in the gate driving circuit 31, the electric energy (electric charge) accumulated in the input capacitance $C_{iss}$ is accumulated in the coil $L_g$ constituting the $L_g C_{iss}$ resonance circuit together with the input capacitance $C_{iss}$, and the electric energy accumulated in the coil $L_g$ is repeatedly accumulated in the input capacitance $C_{iss}$, thereby regenerating the power that has been used to drive the FET 33. The regenerated power is used again to drive the FET 33.

Note that in the above-described power regeneration, power is partly lost as heat and the like. Therefore, the voltage $+V_{DD}$ of the DC power source 54 is applied to the input capacitance $C_{iss}$ at the gate of the FET 33 via the resistance 53 and the switch 51 by periodically turning on the switch 51, thereby replenishing power (electric charge) in the input capacitance $C_{iss}$ of the $L_g C_{iss}$ resonance circuit.

Figure 9:
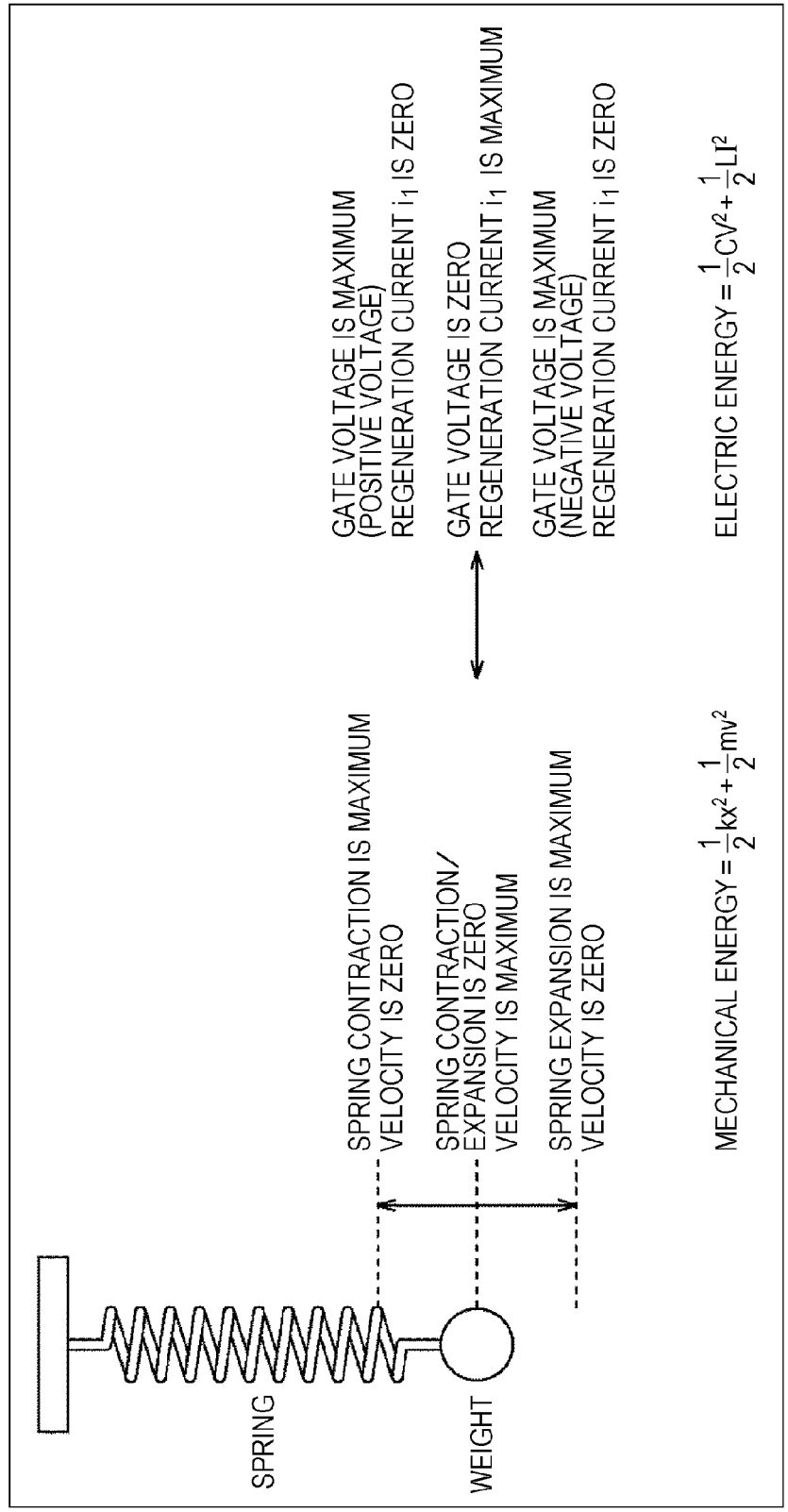
FIG. 9 is a diagram for describing correspondence between power regeneration and vibration (motion) of a spring as mechanics.

FIG. 9 is a diagram for describing correspondence between power regeneration of the gate driving circuit 31 and vibration (motion) of a spring as mechanics.

As illustrated in FIG. 9, one end of a spring (coil spring) is fixed at a ceiling, and a weight is attached at the other end of the spring. In the case of releasing a hand after the spring is expanded or contracted by the hand, the spring expands and contracts in vertical direction (direction parallel to gravity), and the weight attached at the other end of the spring vertically vibrates (moves) along with the expansion and contraction of the spring.

In this case, mechanical energy of the weight is expressed by a formula: $kx^2/2 + mv^2/2$.

Here, k is a spring constant, and x represents a position of the weight (displaced amount) based on a reference position which is a position where the hand is released so as not to vibrate the weight after the weight was attached to the other end of the spring having one end fixed at the ceiling.

Further, m represents mass of the weight, and v represents velocity of the weight.

When the spring contraction is maximum and when the spring expansion is minimum with respect to the reference position, more specifically, when the displaced amount x is maximum and when the displaced amount x is minimum, the weight's velocity v becomes zero.

Further, when the spring expansion and contraction is zero, more specifically, when the displaced amount x is zero, the weight's velocity (velocity) v becomes maximum.

On the other hand, the electric energy of the $L_g C_{iss}$ resonance circuit is expressed by a formula: $CV^2/2 + LI^2/2$.

Here, C represents input capacitance (electrostatic capacitance) $C_{iss}$, and V represents the voltage applied to the input capacitance $C_{iss}$, more specifically, the gate voltage according to the present embodiment.

Further, L represents coil (inductance thereof) $L_g$, and I represents the current $i_1$ flowing in the coil $L_g$.

When the gate voltage is maximum on the positive side and also maximum on the negative side, more specifically, when the gate voltage is maximum and minimum, the current $I=i_1$ flowing in the coil $L_g$ of the $L_g C_{iss}$ resonance circuit becomes zero.

Also, when the gate voltage is zero, the current $I=i_1$ flowing in the coil $L_g$ becomes maximum.

Correspondence between the mechanical energy of the above-described weight and the electric energy of the $L_g C_{iss}$ resonance circuit is, for example: when the spring contraction is maximum corresponds to when the gate voltage is maximum on the positive side, and further when the spring expansion is maximum corresponds to when gate voltage is maximum on the negative side. Further, when the weight velocity v is zero corresponds to when the current $I=i_1$ flowing in the coil $L_g$ is zero.

Also, correspondence between the mechanical energy of the weight and the electric energy of the $L_g C_{iss}$ resonance circuit is, for example: when the spring expansion and contraction is zero corresponds to when the gate voltage is zero. Further, when the weight velocity (velocity) v is maximum corresponds to when the current $I=i_1$ flowing in the coil $L_g$ is maximum.

Figure 10:
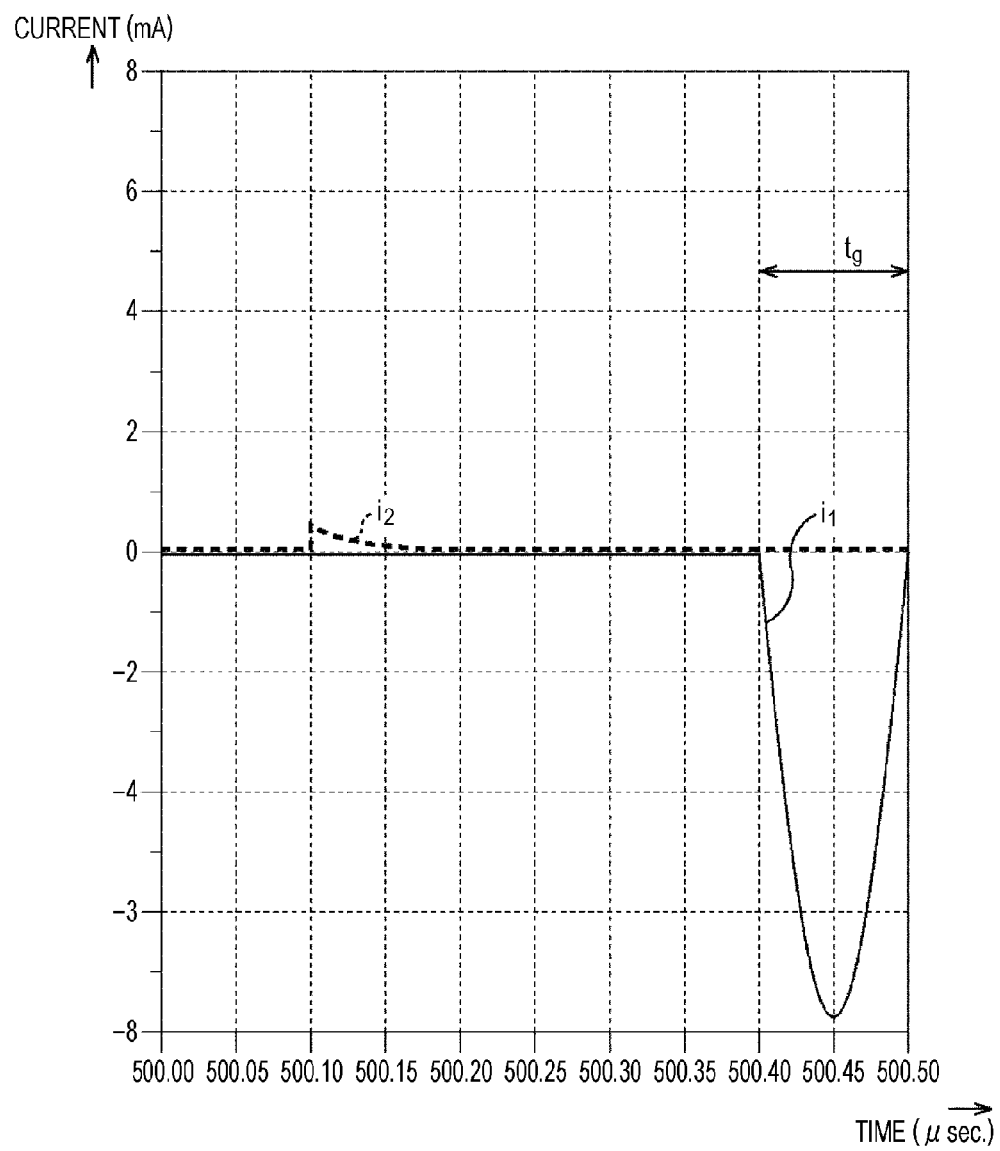
FIG. 10 is a waveform chart illustrating the current $i_1$ and $i_2$.

FIG. 10 is a waveform chart illustrating the current $i_1$ and $i_2$.

As described in FIGS. 5 to 8, when the switch 41 is turned on only for the period $t_g$ and the current $i_1$ flows in the $L_g C_{iss}$ resonance circuit only for the period $t_g$, thereby causing polarity of the gate voltage of the FET 33 to be inverted (level H becomes level L, and level L become level L).

Therefore, an amount of the electric charge necessary to invert the polarity of the gate voltage is a value obtained by integrating the current $i_1$ flowing in the $L_g C_{iss}$ resonance circuit during the period $t_g$.

On the other hand, in the gate driving circuit 31, only the DC power source 54 can supply the electric energy to others without receiving any electric energy supply from outside, and electric energy to be supplied by the DC power source 54 is only the current (replenish current) $i_2$ to replenish power (electric charge) to the input capacitance $C_{iss}$ of the $L_g C_{iss}$ resonance circuit.

The current $i_2$ is smaller, compared to the current $i_1$ as illustrated in FIG. 10, because the current $i_2$ is the replenish current to replenish the power lost as heat and the like.

According to the gate driving circuit 31 having the power regeneration mechanism illustrated in FIG. 4, an amount of current necessary to drive (switch) the FET 33 can be improved from an amount of the current $i_1$ flowing in the $L_g C_{iss}$ resonance circuit to an amount of current $i_2$ which is extremely smaller compared to the current $i_1$.

More specifically, when the FET 33 is turned on, the large current $i_1$ is necessary to charge the large input capacitance $C_{iss}$, and in the case of not regenerating power, the large current $i_1$ (electric charge corresponding thereto) that has been used to turn on the FET 33 is discharged when the FET 33 is turned off. However, according to the gate driving circuit 31 having the power regeneration mechanism, the current $i_1$ is reused by power regeneration, and the power lost as the heat and the like in this power regeneration is replenished with the current $i_2$ which is extremely smaller compared to the large current $i_1$.

Therefore, according to the gate driving circuit 31, loss of the power (electric charge) at the time of switching the FET 33 can be reduced to the power corresponding to the small current $i_2$ from the power corresponding to the large current $i_1$.

Figure 11:
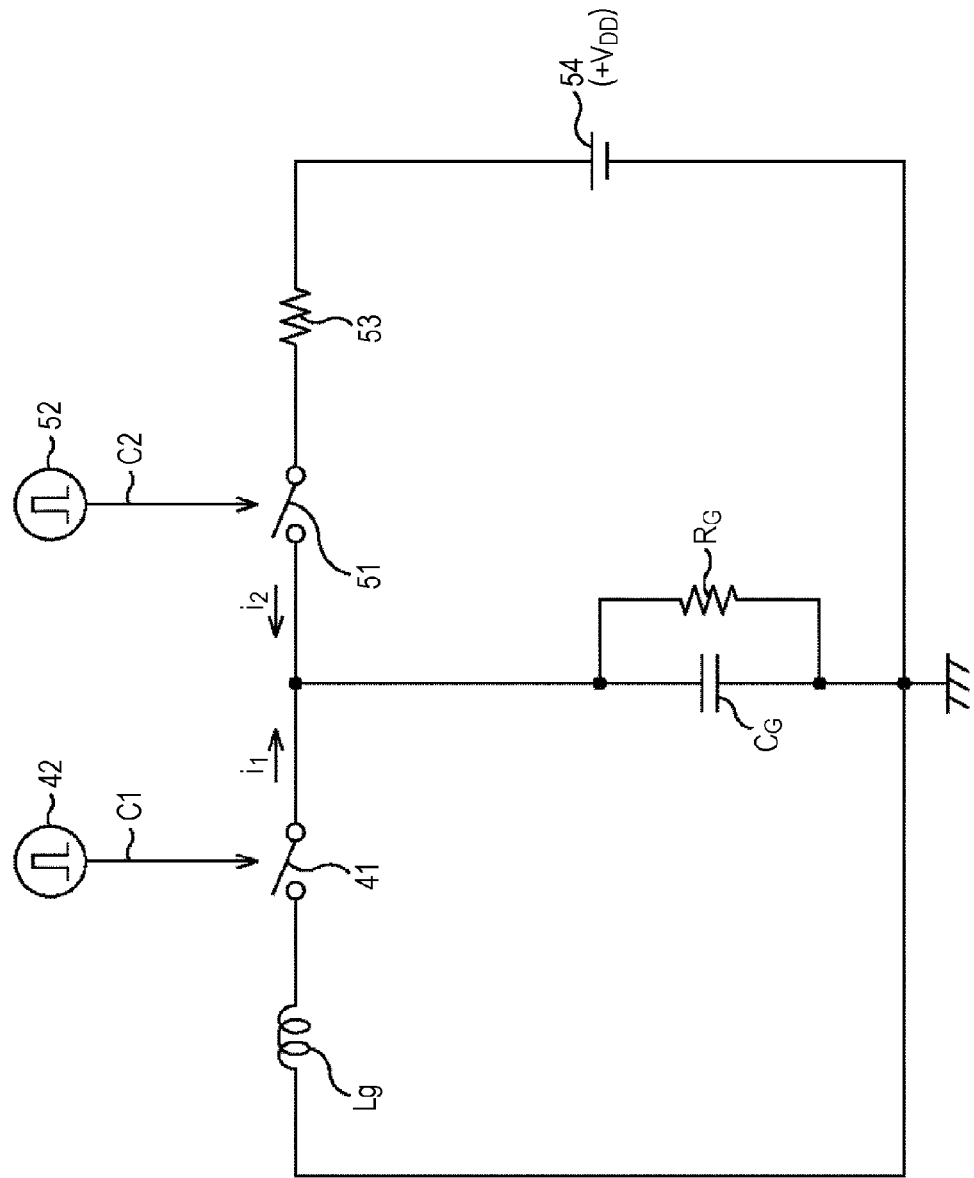
FIG. 11 is a circuit diagram illustrating a circuit used for simulation.

FIG. 11 is a circuit diagram illustrating a circuit (simulation circuit) used for simulation executed to acquire the waveform charts in FIGS. 5 to 8 and 10.

The simulation circuit has the configuration same as the circuit illustrated in FIG. 4 except for a point that a parallel circuit including a capacitor $C_G$ and a resistance $R_G$ is provided in place of the gate of the FET 33 instead of the FET 33 in FIG. 4.

In the simulation circuit of FIG. 11, the capacitor $C_G$ corresponds to the input capacitance $C_{iss}$ at the gate of the FET 33, and the resistance $R_G$ corresponds to input resistance at the gate of the FET 33.

Meanwhile, the resistance $R_G$ as the input resistance at the gate of the FET 33 is a resistance having a considerably high resistance value. Therefore, such a high resistance $R_G$ may not be necessary (can be omitted) in the simulation circuit.

As described above, in the gate driving circuit 31 of FIG. 4, power (electric charge) loss at the time of switching the FET can be reduced only with the simple circuit configuration that includes the coil $L_g$, switch 41, controller 42, switch 51, controller 52, resistance 53, and DC power source 54.

[Second Exemplary Configuration of Gate Driving Circuit 31]

Figure 12:
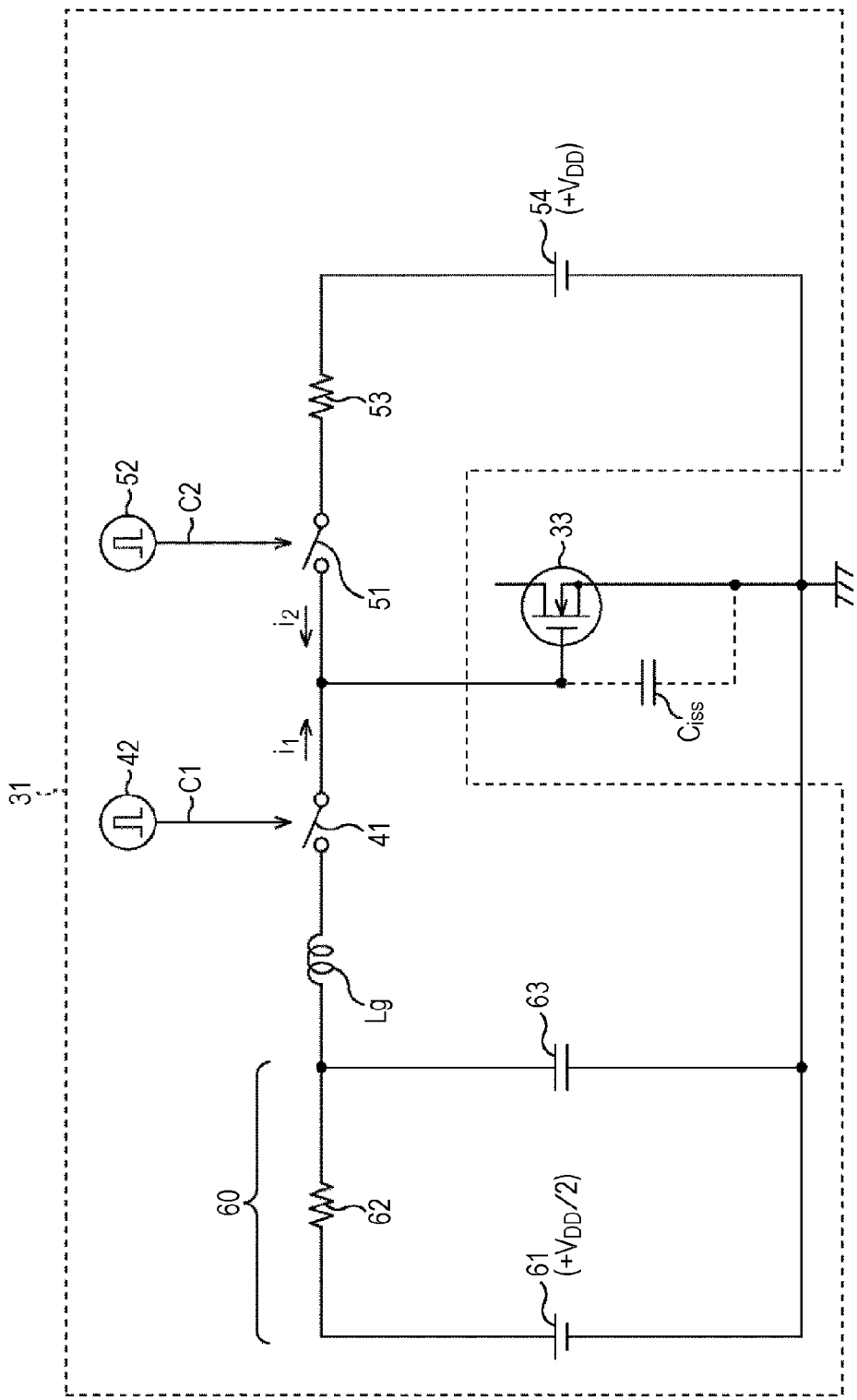
FIG. 12 is a circuit diagram illustrating a second exemplary configuration of a gate driving circuit 31.

FIG. 12 is a circuit diagram illustrating a second exemplary configuration of the gate driving circuit 31 illustrated in FIG. 3.

Note that, in the drawing, portions corresponding to the portions of the first exemplary configuration in FIG. 4 are denoted by the same reference signs, and a description therefor will be suitably omitted in the following.

More specifically, the gate driving circuit 31 in FIG. 12 is same as the first exemplary configuration in FIG. 4 in a point of including the coil $L_g$, switch 41, controller 42, switch 51, controller 52, resistance 53, and DC power source 54.

However, the gate driving circuit 31 in FIG. 12 differs from the first exemplary configuration in FIG. 4 in a point that an offset circuit for (DC voltage) 60 is newly provided.

The offset circuit 60 includes a DC power source 61, a resistance (bias resistance) 62, and a capacitor (bypass capacitor) 63, and offsets the gate voltage of the FET 33 to voltage equal to or more than a predetermined value.

Here, in the first exemplary configuration of FIG. 4, the gate voltage of the FET 33 is the voltage within range from the voltage $+V_{DD}$ which is the voltage of the DC power source 54 to the voltage $-V_{DD}$ having an inverted sign of the voltage $+V_{DD}$ as described in FIGS. 7 and 8.

There may be a case in which the negative voltage is not scheduled to apply to the gate of the NMOS FET, and reliability of the gate driving circuit 31 may be impaired in the case where the negative voltage $-V_{DD}$ is lower than a performance assurance voltage by which performance of the FET is assured.

Therefore, according to the gate driving circuit 31 in FIG. 12, the gate voltage of the FET 33 is offset to the voltage of a predetermined value, for example, zero V or more by the offset circuit 60.

Here, according to the gate driving circuit 31 in FIG. 12, the gate voltage is offset so as to be the voltage within the range from the voltage $+V_{DD}$ which is the voltage of the DC power source 54 to zero V.

More specifically, the DC power source 61 is a power source configured to output, for example, DC voltage $+V_{DD}/2$ which is ½ of the DC voltage $+V_{DD}$ output from the DC power source 54. The DC power source 61 has a plus terminal connected to one end of the resistance 62, and the DC power source 61 has a minus terminal connected to one end of the capacitor 63.

The resistance 62 the resistance to bias one end of the coil $L_g$ which is not connected to the switch 41, and furthermore to bias the gate of the FET 33. As described above, the resistance 62 has the one end connected to the plus terminal of the DC power source 61, and the resistance 62 has the other end connected to the capacitor 63.

The capacitor 63 is a capacitor to bypass the current flowing in the $L_g C_{iss}$ resonance circuit. As described above, the capacitor 63 has the one end connected to the minus terminal of the DC power source 61, and the capacitor 63 has the other end connected to the other end of the resistance 62.

Further, a connection point of the resistance 62 and the capacitor 63 of the offset circuit 60 thus configured is connected to the one end of the coil $L_g$ not connected to the switch 41 (the other end of the coil $L_g$ having the one end connected to the gate of the FET 44 via the switch 41), and a connection point of the DC power source 61 and the capacitor 63 is connected to the source of the FET 33 (which is also a ground wire in FIG. 12).

In the $L_g C_{iss}$ resonance circuit of FIG. 12, the current $i_1$ flows at the same timing as the case of FIG. 4 via (bypassing) the capacitor 63.

However, in the offset circuit 60, the one end of the coil $L_g$ not connected to the switch 41 does not have voltage of zero V (ground wire level) but the voltage biased to the voltage $+V_{DD}/2$ of the DC power source 61, and the voltage applied to the coil $L_g$ becomes $+V_{DD}/2$ from the $+V_{DD}$.

As a result, the current $i_1$ flowing in the coil $L_g$ becomes ½ of the case in FIG. 4, and further the gate voltage of the FET 33 becomes within a range which is reduced to a half of the range of the gate voltage in the case of FIG. 4 and then biased by the voltage $+V_{DD}/2$, more specifically, the range from the voltage $+V_{DD}$ to zero V because the gate of the FET 33 is biased by the voltage $+V_{DD}/2$ from the case of FIG. 4.

[Operation in Second Exemplary Configuration of Gate Driving Circuit 31]

Figure 13:
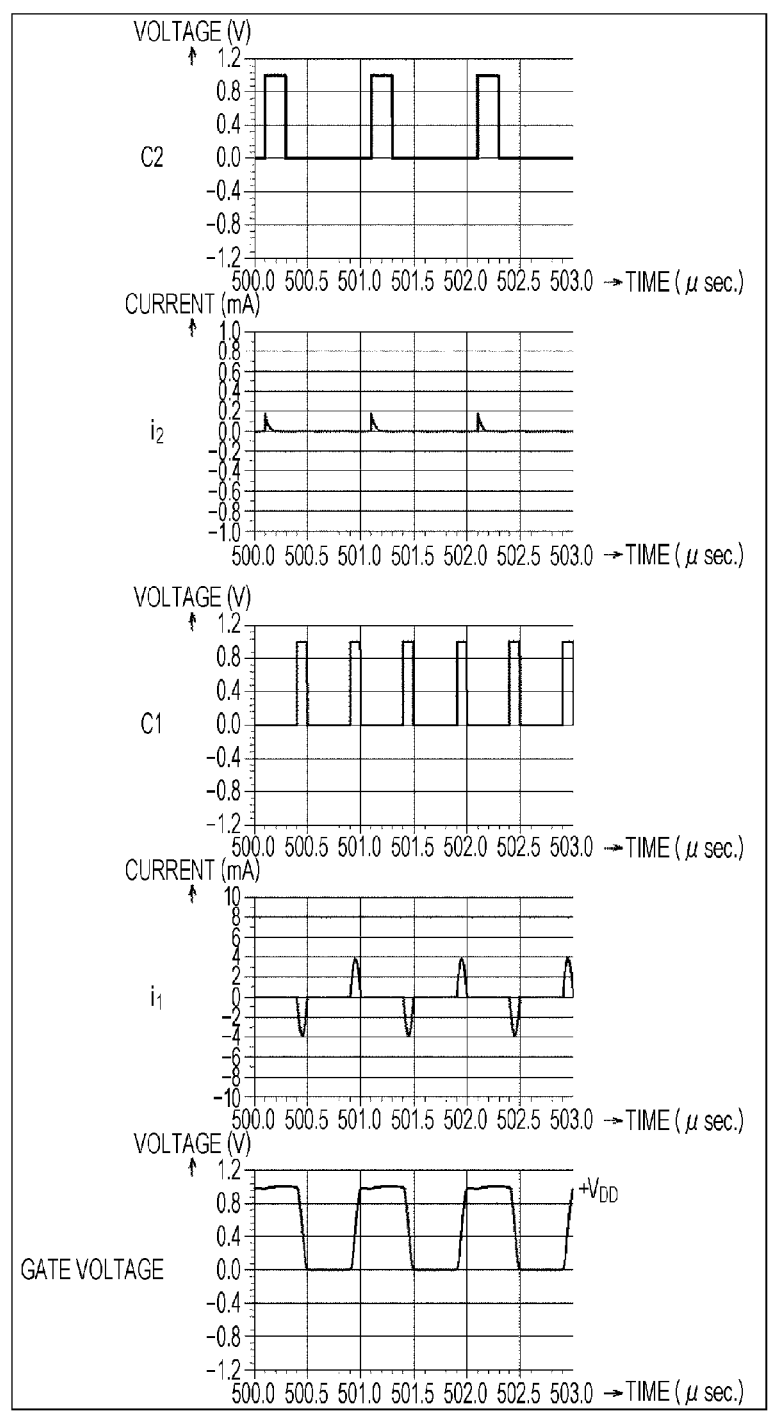
FIG. 13 is a waveform chart illustrating a control signal C2, current $i_2$ that flows by a switch 51 being turned on/off, a control signal C1, current $i_1$ that flows by a switch 41 being turned on/off, and gate voltage.

FIG. 13 is a waveform chart illustrating on/off states of the switch 51 (control signal C2), current $i_2$ flowing by the switch 51 being turned on and off, on/off states of the switch 41 (control signal C1), current $i_1$ flowing by the switch 41 being turned on and off, and gate voltage as for the gate driving circuit 31 in FIG. 12.

Even in the case where the offset circuit 60 is provided, the on/off states of the switch 51 (control signal C2), the current $i_2$ flowing by the switch 51 being turned on and off, and the on/off states of the switch 41 (control signal C1) are the same as the case described in FIGS. 5 to 8 in which the offset circuit 60 is not provided.

The current $i_1$ flowing by the switch 41 being turned on and off becomes, as illustrated in FIG. 13, ½ of the case described in FIGS. 5 to 8.

More specifically, according to the offset circuit 60, one end of the coil $L_g$ not connected to the switch 41 is biased to the voltage $+V_{DD}/2$ of the DC power source 61.

Here, for example, in the case where the gate voltage is the voltage $+V_{DD}$, a potential difference between both ends of the coil $L_g$ becomes voltage $+V_{DD} (=+V_{DD}-0)$ because the one end of the coil $L_g$ not connected to the switch 41 is connected to the ground wire in the gate driving circuit 31 in FIG. 4.

On the other hand, according to the gate driving circuit 31 in FIG. 12, for example, in the case where the gate voltage is the voltage $+V_{DD}$, the potential difference between both ends of the coil $L_g$ becomes voltage $+V_{DD}/2 (=+V_{DD}-V_{DD}/2)$ because the one end of the coil $L_g$ not connected to the switch 41 is biased to the voltage $+V_{DD}/2$.

As a result, according to the gate driving circuit 31 in FIG. 12, the current $i_1$ flowing in the coil $L_g$ and also in the $L_g C_{iss}$ resonance circuit becomes ½ of the case in FIG. 4, and the range of the gate voltage also becomes ½ of the range from the voltage $-V_{DD}$ to the voltage $+V_{DD}$ in the case in FIG. 4.

Further, according to the gate driving circuit 31 in FIG. 12, the gate voltage is also biased by the voltage $+V_{DD}/2$ because the one end of the coil $L_g$ not connected to the switch 41 is biased to the voltage $+V_{DD}/2$. Consequently, the range of the gate voltage becomes, as illustrated in FIG. 13, the range from zero V to the voltage $+V_{DD}$ obtained by biasing the ½ range of the range from the voltage $-V_{DD}$ to the voltage $+V_{DD}$ in the case of FIG. 4 by the voltage $+V_{DD}/2$.

Figure 14:
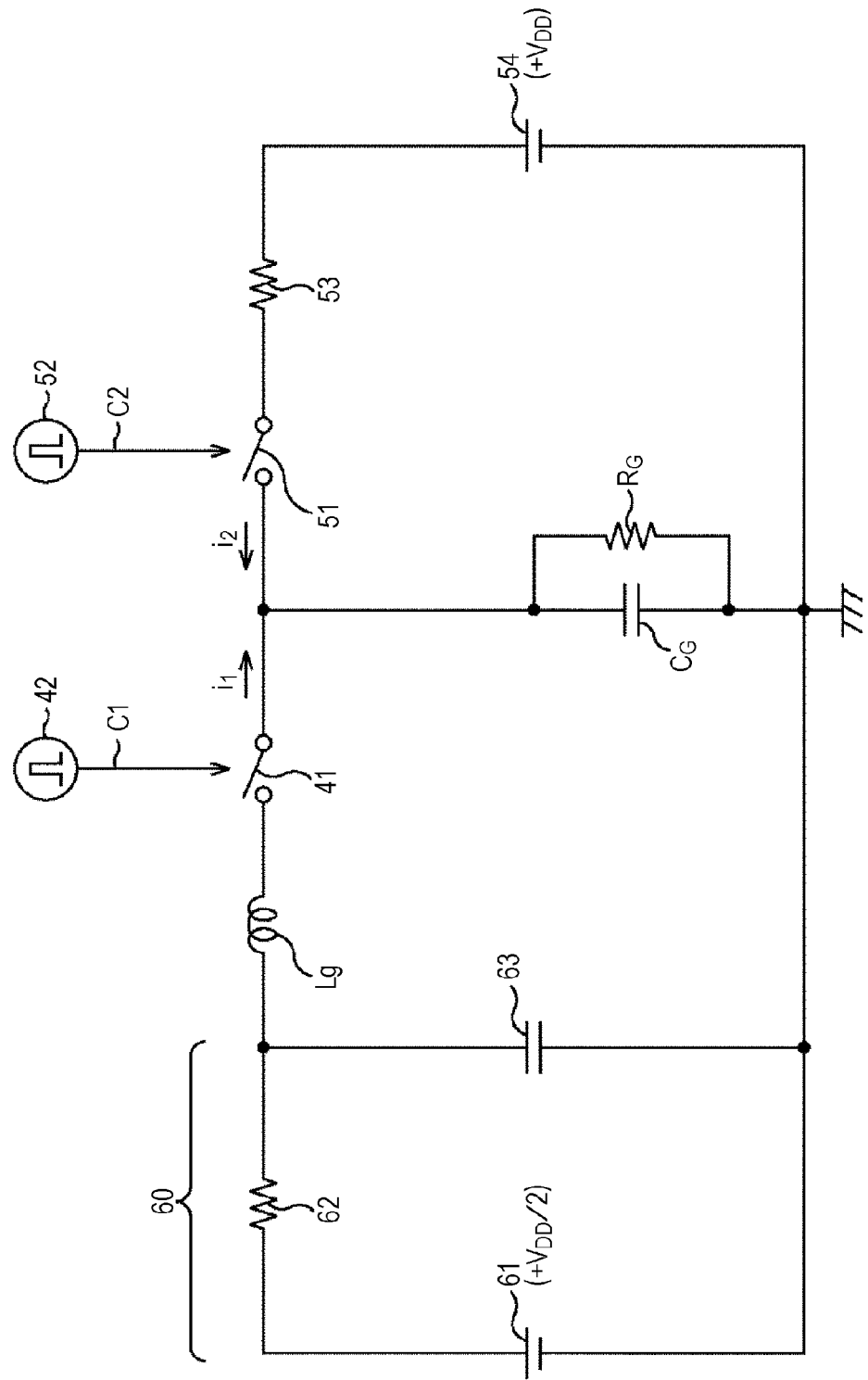
FIG. 14 is a circuit diagram illustrating a circuit used for simulation.

FIG. 14 is a circuit diagram illustrating a circuit (simulation circuit) used for the simulation executed to acquire the waveform charts in FIG. 13.

The simulation circuit has the configuration same as the circuit illustrated in FIG. 12 except for a point that a parallel circuit including a capacitor $C_G$ and a resistance $R_G$ is provided in place of the gate of the FET 33 instead of the FET 33 in FIG. 12.

As illustrated in FIG. 11, the capacitor $C_G$ corresponds to the input capacitance $C_{iss}$ at the gate of the FET 33, and the resistance $R_G$ corresponds to the input resistance at the gate of the FET 33. Further, in the simulation circuit, the resistance $R_G$ may be omitted.

[Third Exemplary Configuration of Gate Driving Circuit 31]

Figure 15:
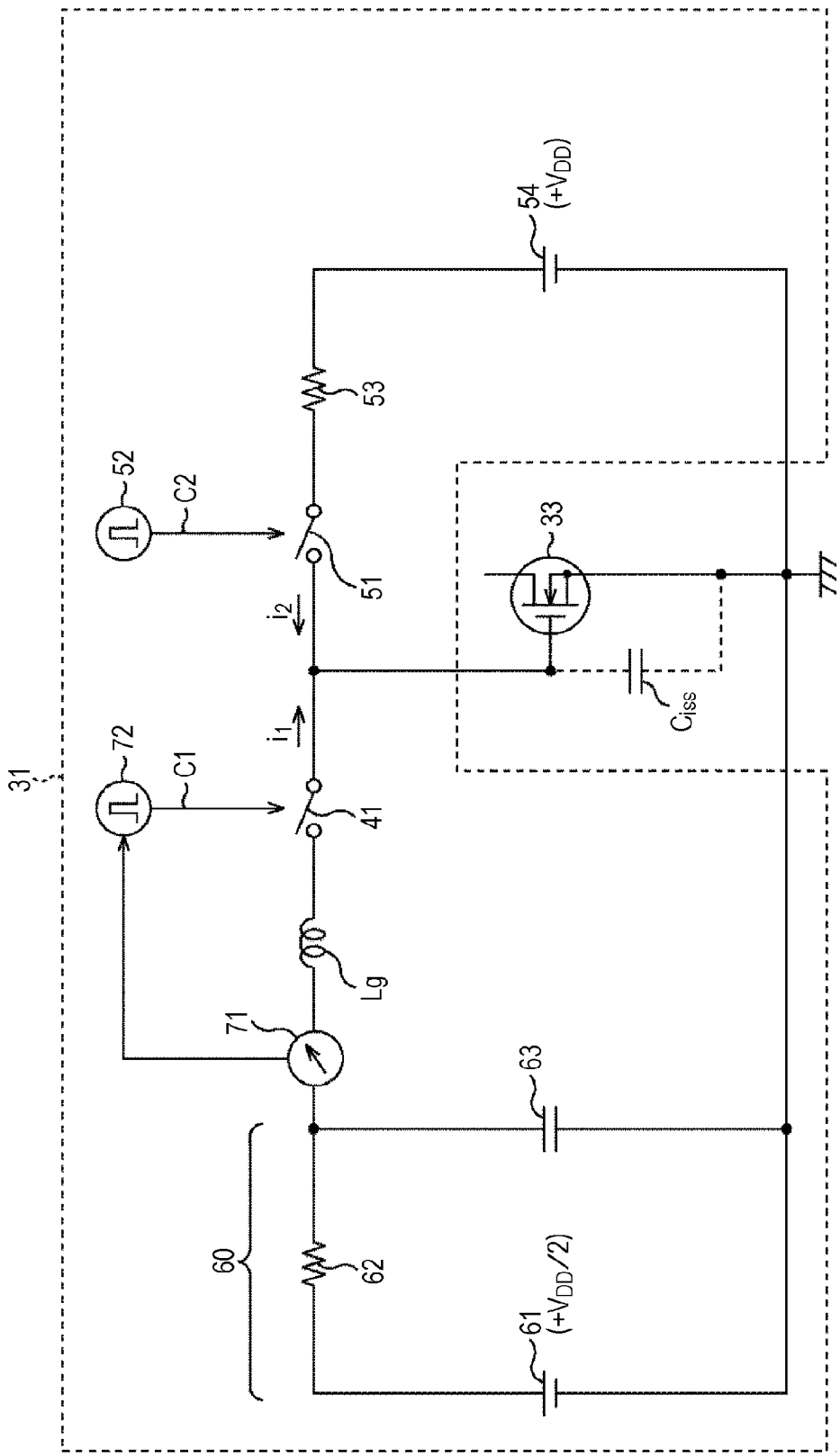
FIG. 15 is a circuit diagram illustrating a third exemplary configuration of a gate driving circuit 31.

FIG. 15 is a circuit diagram illustrating a third exemplary configuration of the gate driving circuit 31 in FIG. 3.

Note that, in the drawing, portions corresponding to the portions of the second exemplary configuration in FIG. 12 are denoted by the same reference signs, and a description therefor will be suitably omitted in the following.

More specifically, the gate driving circuit 31 in FIG. 15 is same as the second exemplary configuration in FIG. 12 in a point of including the coil $L_g$, switch 41, switch 51, controller 52, resistance 53, DC power source 54, and offset circuit 60.

However, the gate driving circuit 31 in FIG. 15 differs from the second exemplary configuration in FIG. 12 in a point that a current detector 71 is newly provided, and further a controller 72 is provided instead of the controller 42.

Here, the input capacitance (electrostatic capacitance) $C_{iss}$ of the FET 33 and the inductance of the coil $L_g$ may be varied. In the case where the input capacitance $C_{iss}$ and the inductance of the coil $L_g$ are varied, the resonance cycle $2\pi\sqrt{(L_g C_{iss})}=2\times t_g$ of the $L_g C_{iss}$ resonance circuit is changed, and therefore, the period $t_g$ during which the switch 41 is turned on, more specifically, the timing to turn off the switch 41 after having turned on the switch 41 is changed.

A method of preventing such a change of the resonance cycle $2\pi\sqrt{(L_g C_{iss})}$ of the $L_g C_{iss}$ resonance circuit is, for example, to provide a trimmer capacitor in parallel to the gate (input capacitance $C_{iss}$) of the FET 33 and adjust the trimmer capacitor for each driver circuit 23 (individually) in FIG. 3 such that the resonance cycle of the $L_g C_{iss}$ resonance circuit conforms to the resonance cycle $2\pi\sqrt{(L_g C_{iss})}$ determined based on a preliminarily assumed input capacitance $C_{iss}$ and the coil $L_g$.

However, it can be hardly said that the method of preventing the change of the resonance cycle $2\pi\sqrt{(L_g C_{iss})}$ of the $L_g C_{iss}$ resonance circuit by providing the trimmer capacitor is advantageous in view of time and labor, such as adjusting the trimmer capacitor, cost for providing the trimmer capacitor, an area required for mounting the same, and so on.

Therefore, according to the gate driving circuit 31 in FIG. 15, switching (on/off) of the switch 41 is adaptively controlled, thereby preventing the resonance cycle $2\pi\sqrt{(L_g C_{iss})}$ of the $L_g C_{iss}$ resonance circuit from being changed without providing the trimmer capacitor.

Therefore, according to the gate driving circuit 31 in FIG. 15, it is advantageous in a point that the labor, cost, mounting area, etc., required to provide the trimmer capacitor are not necessary.

In FIG. 15, the current detector 71 detects the current $i_1$ (current value thereof) flowing in the coil $L_g$ and supplies the current value to the controller 72.

The controller 72 controls the switch 41 (on/off thereof) by supplying the control signal C1 to the switch 41 in the same manner as the controller 42 in FIG. 4.

However, the controller 72 controls the switch 41 such that the switch 41 is turned on, for example, in the cycle $t_{CLK}/2$ which is ½ of the cycle $t_{CLK}$ as a cycle corresponding to the cycle $t_{CLK}$ of switching the FET 33 and further the switch 41 is later turned off in accordance with the current $i_1$ supplied from the current detector 71.

[Operation in Third Exemplary Configuration of Gate Driving Circuit 31]

Figure 16:
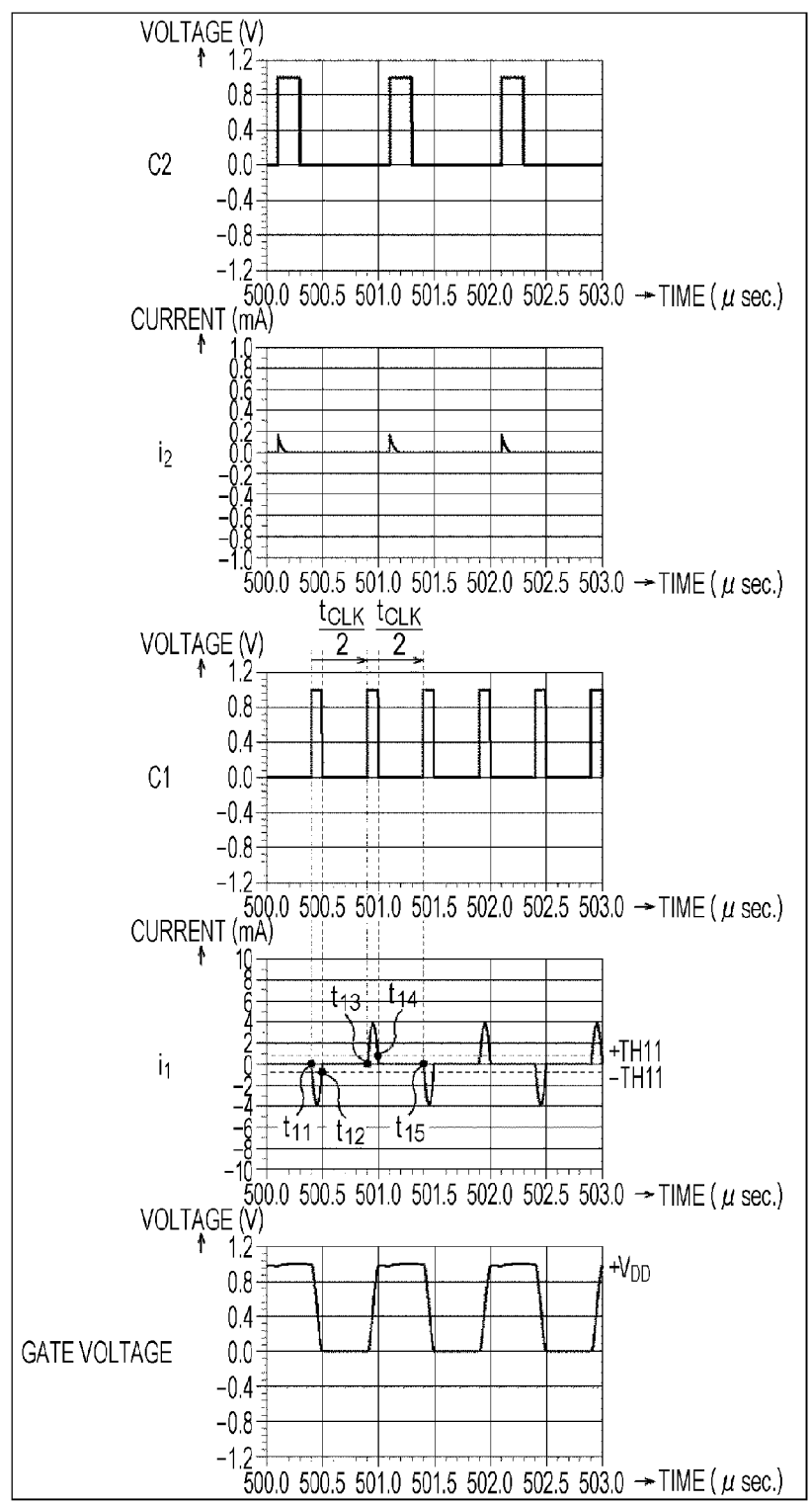
FIG. 16 is a waveform chart illustrating a control signal C2, current $i_2$ that flows by a switch 51 being turned on/off, a control signal C1, current $i_1$ that flows by a switch 41 being turned on/off, and gate voltage.

FIG. 16 is a waveform chart illustrating on/off states of the switch 51 (control signal C2), current $i_2$ flowing by the switch 51 being turned on and off, on/off states of the switch 41 (control signal C1), current $i_1$ flowing by the switch 41 being turned on and off, and gate voltage as for the gate driving circuit 31 in FIG. 15.

The on/off states of the switch 51 (control signal C2), the current $i_2$ flowing by the switch 51 being turned on and off are the same as the case described in FIGS. 5 to 8.

Further, the switch 41 (control signal C1) is turned on in the cycle $t_{CLK}/2$ as illustrated in FIG. 5.

Here, in FIG. 5, the switch 41 is turned in the cycle $t_{CLK}/2$ only for the period $t_g=\pi\sqrt{(L_g C_{iss})}$, more specifically, the switch 41 is turned on in the cycle $t_{CLK}/2$ and turned off after the period $t_g=\pi\sqrt{(L_g C_{iss})}$ has passed after the switch 41 was turned on. However, according to the gate driving circuit 31 in FIG. 15, the controller 72 adaptively turns off the switch 41 based on the current $i_1$ detected by the current detector 71.

The switch 41 is turned off by control of the controller 72 when the current $i_1$ value (absolute value $|i_1|$) becomes a predetermined threshold value (or less) after the switch 41 is turned on.

As a result, the current $i_1$ flows as illustrated in FIG. 16.

More specifically, for example, in the case where electric charge is accumulated in the input capacitance $C_{iss}$ now such that the gate voltage becomes the voltage $+V_{DD}$ and the switch 41 is turned on at time $t_{11}$, the electric charge accumulated in the input capacitance $C_{iss}$ sequentially flows (is discharged) from the input capacitance $C_{iss}$ to the switch 41 and the coil $L_g$, thereby causing the current $i_1$ to flow to the coil $L_g$ in the negative direction. The current $i_1$ is expressed by sine waves of the resonance cycle $2\pi\sqrt{(L_g C_{iss})}$ of the $L_g C_{iss}$ resonance circuit.

The current $i_1$ flows in the negative direction, thereby lowering the gate voltage from the voltage $+V_{DD}$.

Further, all of the electric charge accumulated in the input capacitance $C_{iss}$ is discharged, the gate voltage becomes the voltage (bias voltage) $+V_{DD}/2$ biased at the offset circuit 60. Further, the current $i_1$ flowing in the coil $L_g$ tries to become zero A, but the current $i_1$ continuously flows in the coil $L_g$ due to inertia.

The current $i_1$ continuously flows in the coil $L_g$, thereby accumulating (charging) the electric charge in the input capacitance $C_{iss}$ such that the gate voltage becomes lower than the bias voltage $+V_{DD}/2$.

Here, in theory, the current $i_1$ flowing in the coil $L_g$ becomes zero A when the period which is ½ of the resonance cycle $2\pi\sqrt{(L_g C_{iss})}$ of the $L_g C_{iss}$ resonance circuit has passed from the time $t_{11}$ that is immediately before the switch 41 was turned on and the current $i_1$ started flowing.

Therefore, in the case where the predetermined threshold value is set to zero, the timing when the current $i_1$ becomes zero that is the predetermined threshold value is to be the timing when the ½ of the resonance cycle $2\pi\sqrt{(L_g C_{iss})}$ of the $L_g C_{iss}$ resonance circuit has passed from the time $t_{11}$ which is immediately before the current $i_1$ started flowing.

Further, at the timing when the ½ of the resonance cycle $2\pi\sqrt{(L_g C_{iss})}$ of the $L_g C_{iss}$ resonance circuit has passed from the time $t_{11}$ which is immediately before the current $i_1$ started flowing, the electric charge is (must have been) accumulated in the input capacitance $C_{iss}$ such that the gate voltage becomes zero V which is lower than the bias voltage $+V_{DD}/2$ by the voltage $V_{DD}/2$. Therefore, it is ideal to turn off the switch 41 and fix the gate voltage at zero V at this timing.

However, in the actual circuit, when operation such as turning off the switch 41 is started after detecting that the current $i_1$ becomes zero which is the predetermined threshold value, there may be a problem in which the timing is delayed or the like.

Therefore, according to the present embodiment, a value obtained by subtracting a margin from zero A, more specifically, a positive value +TH11 and a negative value −TH11 obtained from a small positive value TH11 close to zero A are set as the predetermined threshold value of the current $i_1$. The controller 72 controls the switch 41 to be turned off when the current $i_1$ becomes the threshold value +TH11 or −TH11, deeming that the ½ of the resonance cycle $2\pi\sqrt{(L_g C_{iss})}$ of the $L_g C_{iss}$ resonance circuit has passed after the current $i_1$ started flowing.

In FIG. 16, the current $i_1$ continuously flowing in the coil $L_g$ due to inertia becomes the threshold value −TH11 at time $t_{12}$, and the switch 41 is turned off at time $t_{12}$.

At this point, the electric charge is accumulated in the input capacitance $C_{iss}$ such that the gate voltage becomes (substantially) zero V, and the $L_g C_{iss}$ resonance circuit is opened by the switch 41 being turned off, and the gate voltage is fixed at zero V as illustrated in FIG. 16.

The switch 41 is turned on again at time $t_{13}$ when the cycle $t_{CLK}/2$ which is ½ of the cycle $t_{CLK}$ of switching the FET 33 has passed from the time $t_{11}$ when the switch 41 was previously turned on.

When the switch 41 is turned on, the electric charge accumulated in the capacitor 63 sequentially flows (is charged) to coil $L_g$, switch 41, and the input capacitance $C_{iss}$, thereby causing the current $i_1$ to flow to the coil $L_g$ in the positive direction. The current $i_1$ is expressed by the sine waves of the resonance cycle $2\pi\sqrt{(L_g C_{iss})}$ of the $L_g C_{iss}$ resonance circuit.

The current $i_1$ flows in the positive direction, thereby raising the gate voltage from zero V.

Further, the gate voltage reaches the bias voltage $+V_{DD}/2$ and the current $i_1$ flowing in the coil $L_g$ tries to become zero A, but the current $i_1$ continuously flows in the coil $L_g$ due to inertia.

The current $i_1$ continuously flows in the coil $L_g$, thereby accumulating (charging) the electric charge in the input capacitance $C_{iss}$ such that the gate voltage becomes higher than the bias voltage $+V_{DD}/2$.

Then, the controller 72 controls the switch 41 to be turned off when the current $i_1$ becomes the threshold value +TH11 or −TH11 after the current $i_1$ starts flowing, deeming that ½ of the resonance cycle $2\pi\sqrt{(L_g C_{iss})}$ of the $L_g C_{iss}$ resonance circuit has passed.

In FIG. 16, the current $i_1$ continuously flowing in the coil $L_g$ due to inertia becomes the threshold value +TH11 at time $t_{14}$ after the switch 41 is turned on at time $t_{13}$, and the switch 41 is turned off at time $t_{14}$.

At this point, the electric charge is accumulated in the input capacitance $C_{iss}$ such that the gate voltage becomes (substantially) $+V_{DD}$, and the $L_g C_{iss}$ resonance circuit is opened by the switch 41 being turned off and the gate voltage is fixed at the voltage $+V_{DD}$ as illustrated in FIG. 16.

The switch 41 is turned on again at time $t_{15}$ when the cycle $t_{CLK}/2$ which is ½ of the switching cycle $t_{CLK}$ of the FET 33 has passed from the time $t_{13}$ when the switch 41 was previously turned on. Then, the same processing is repeated afterward.

Figure 17:
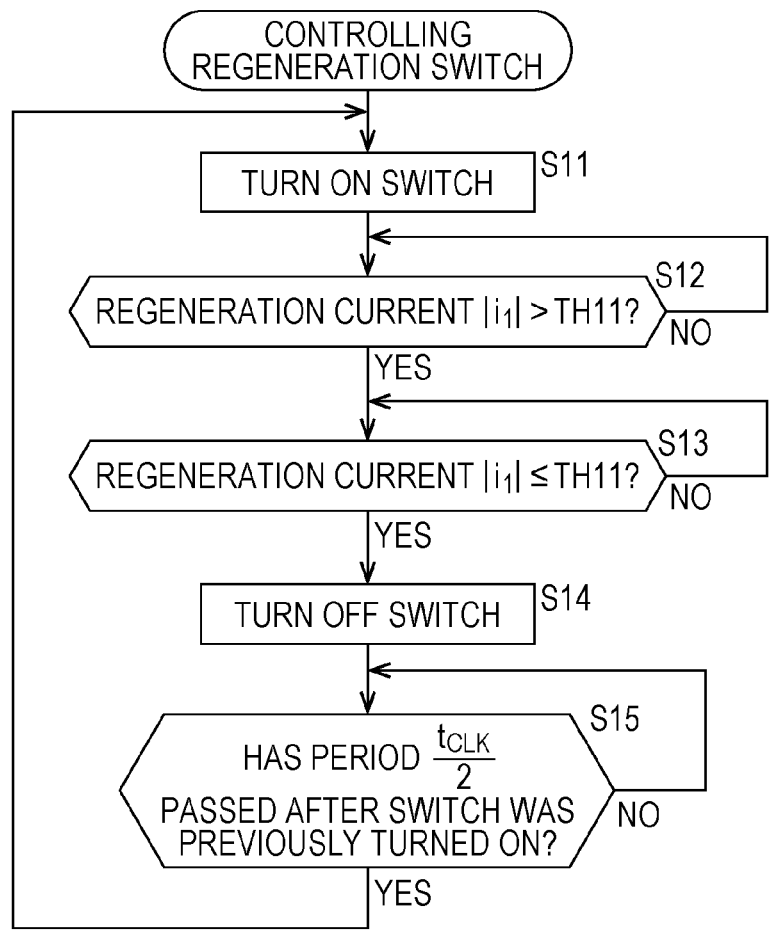
FIG. 17 is a flowchart for describing control of the switch 41 by a controller 72.

FIG. 17 is a flowchart for describing control of the switch 41 by the controller 72 in FIG. 15.

In step S11, the controller 72 turns on the switch 41, and processing proceeds to step S12.

In step S12, the controller 72 determines whether a value (absolute value) $|i_1|$ of the current $i_1$ detected by the current detector 71 has become larger than (equal to or more than) the threshold value TH11.

In the case where it is determined in step S12 that the value $|i_1|$ of the current $i_1$ has not become larger than threshold value TH11, the processing returns to step S12.

Further, in the case where it is determined in step S12 that the value $|i_1|$ of the current $i_1$ has become larger than threshold value TH11, the processing proceeds to step S13, and the controller 72 determines whether the value $|i_1|$ of the current $i_1$ detected by the current detector 71 has become equal to or less than the threshold value TH11.

In the case where it is determined in step S13 that the value $|i_1|$ of the current $i_1$ is not equal to or not less than the threshold value TH11, the processing returns to step S13.

In the case where it is determined in step S13 that the value $|i_1|$ of the current $i_1$ has become equal to or less than the threshold value TH11, the processing proceeds to step S14, and the controller 72 turns off the switch 41, deeming that the ½ of the resonance cycle $2\pi\sqrt{(L_g C_{iss})}$ of the $L_g C_{iss}$ resonance circuit has passed after the current $i_1$ started flowing. Then, the processing proceeds to step S15.

Here, as illustrated in FIG. 16, when the switch 41 is turned on, the current $i_1$ flowing in the coil $L_g$ is zero A, and after the switch 41 is turned on, the current $i_1$ rises from zero A, and again lowers to zero A afterward.

Therefore, after the switch 41 is turned on, the value $|i_1|$ of the current $i_1$ rises from zero A and exceeds the threshold value TH11, and then lowers to the threshold value TH11 or less.

The timing to turn off the switch 41 is when the value $|i_1|$ of the current $i_1$ lowers and becomes the threshold value TH11. Therefore, in FIG. 17, it is determined in step S12 that the value $|i_1|$ of the current $i_1$ has become larger than the threshold value TH11, and after confirming that the value $|i_1|$ of the current $i_1$ has risen from zero A and exceeds the threshold value TH11, it is determined in step S13 whether the value $|i_1|$ of the current $i_1$ has become the threshold value TH11 or less, more specifically, whether it is the timing to turn off the switch 41.

In step S15, the controller 72 determines whether the period $t_{CLK}/2$ has passed from (the timing) when the switch 41 was previously turned on.

In the case where it is determined in step S15 that the period $t_{CLK}/2$ has not passed from when the switch 41 was previously turned on, the processing returns to step S15.

Further, in the case where it is determined in step S15 that the period $t_{CLK}/2$ has passed from when the switch 41 was previously turned on, the processing returns to step S11 and the controller 72 turns on the switch 41. Then, the same processing is repeated afterward.

[Fourth Exemplary Configuration of Gate Driving Circuit 31]

Figure 18:
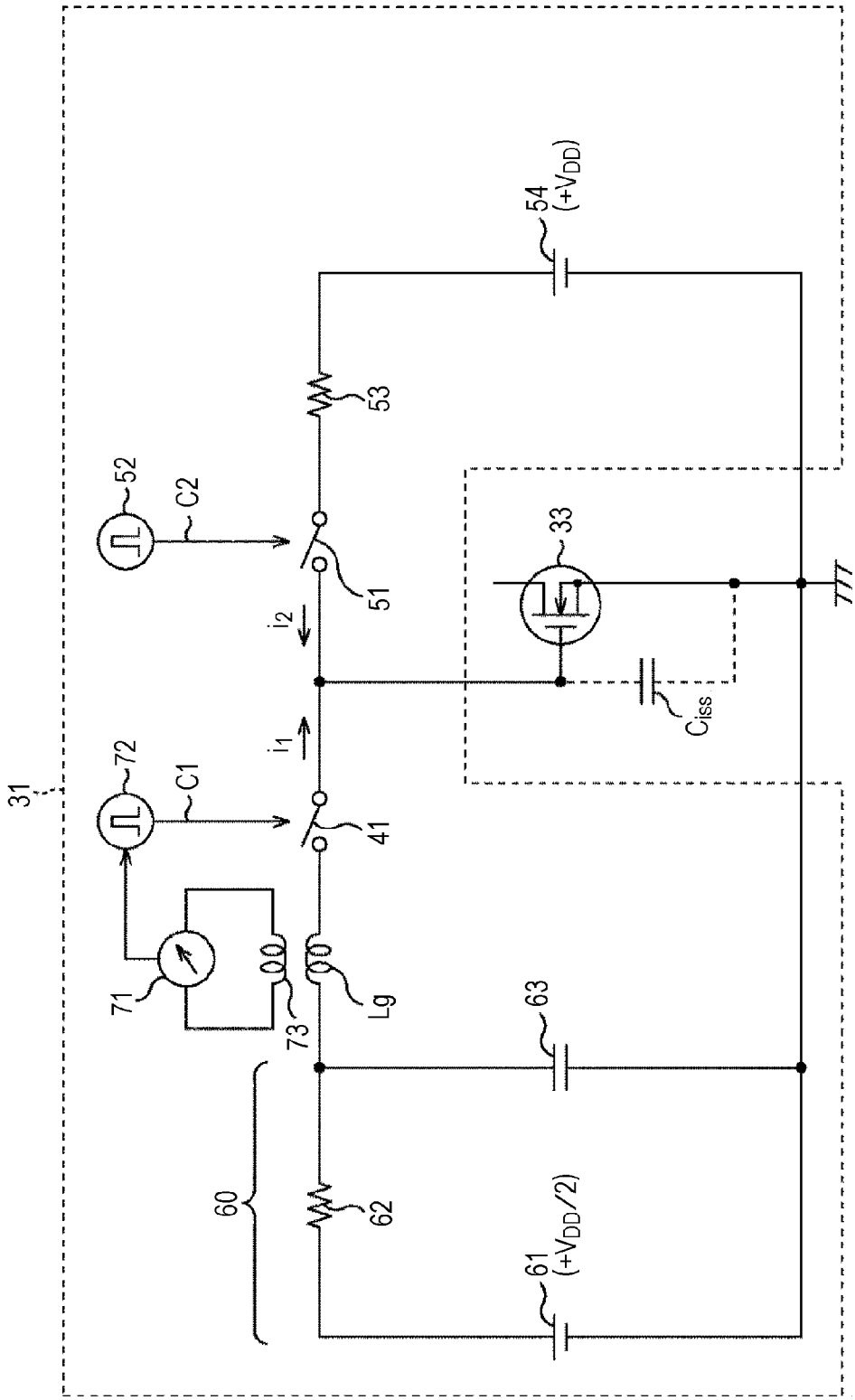
FIG. 18 is a circuit diagram illustrating a fourth exemplary configuration of a gate driving circuit 31.

FIG. 18 is a circuit diagram illustrating a fourth exemplary configuration of the gate driving circuit 31 in FIG. 3.

Note that, in the drawing, portions corresponding to the portions of the third exemplary configuration in FIG. 15 are denoted by the same reference signs, and a description therefor will be suitably omitted in the following.

The gate driving circuit 31 in FIG. 18 is same as the third exemplary configuration in FIG. 15 in a point of including the coil $L_g$, switch 41, switch 51, controller 52, resistance 53, DC power source 54, offset circuit 60, current detector 71, and controller 72.

However, the gate driving circuit 31 in FIG. 18 differs from the third exemplary configuration in FIG. 15 in a point that a coil 73 is provided and the current detector 71 detects the current $i_1$ (current value thereof) flowing in the coil $L_g$ based on current flowing in the coil 73.

In the gate driving circuit 31 in FIG. 18 also, switching of the switch 41 is adaptively controlled same as the gate driving circuit 31 in FIG. 15, thereby preventing the resonance cycle $2\pi\sqrt{(L_g C_{iss})}$ of the $L_g C_{iss}$ resonance circuit from being changed without providing the trimmer capacitor.

More specifically, the coil 73 is disposed in the vicinity of the coil $L_g$, and therefore, current proportional to the current $i_1$ flowing in the coil $L_g$ flows in the coil 73 due to electromagnetic induction.

The current detector 71 detects the current flowing in the coil 73, and detects the current $i_1$ (current value thereof) flowing in the coil $L_g$ based on the current, and then supplies the current value to the controller 72.

The controller 72 controls the switch 41 (on/off thereof) by supplying the control signal C1 to the switch 41 in the same manner as the case described in FIGS. 15 to 17.

[Fifth Exemplary Configuration of Gate Driving Circuit 31]

Figure 19:
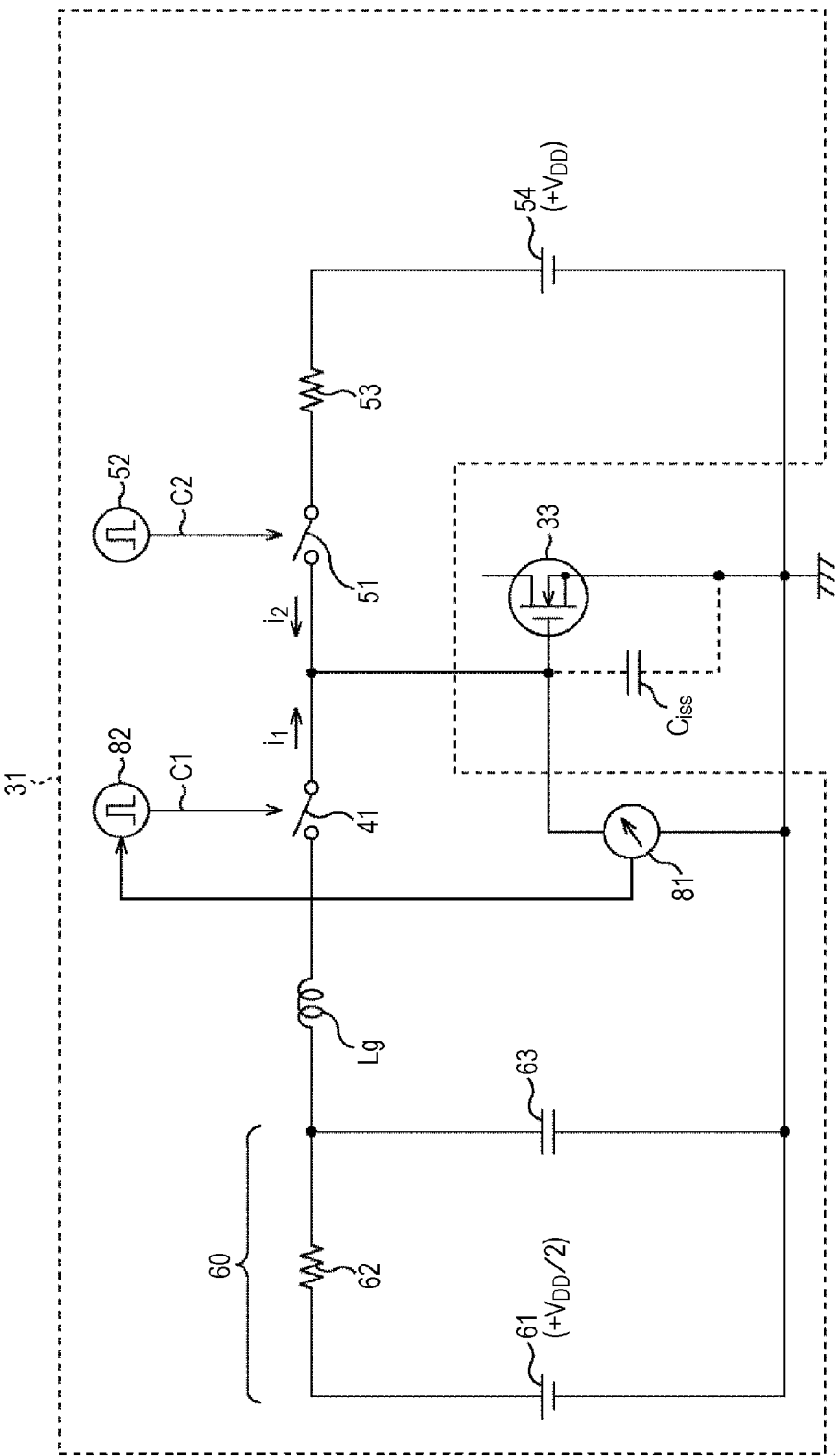
FIG. 19 is a circuit diagram illustrating a fifth exemplary configuration of a gate driving circuit 31.

FIG. 19 is a circuit diagram illustrating a fifth exemplary configuration of the gate driving circuit 31 in FIG. 3.

Note that, in the drawing, portions corresponding to the portions the second exemplary configuration in FIG. 12 are denoted by the same reference signs, and a description therefor will be suitably omitted in the following.

The gate driving circuit 31 in FIG. 19 is same as the second exemplary configuration in FIG. 12 in a point of including the coil $L_g$, switch 41, switch 51, controller 52, resistance 53, DC power source 54, and offset circuit 60.

However, the gate driving circuit 31 in FIG. 19 differs from the second exemplary configuration in FIG. 12 in a point that a voltage detector 81 is newly provided and a controller 82 is provided instead of the controller 42.

The voltage detector 81 detects the gate voltage (value) and supplies the voltage value to the controller 82.

The controller 82 controls the switch 41 (on/off thereof) by supplying the control signal C1 to the switch 41 in the same manner as the controller 42 in FIG. 4.

However, the controller 82 controls the switch 41 such that the switch 41 is turned on, for example, in the cycle $t_{CLK}/2$ which is ½ of the cycle $t_{CLK}$ as a cycle corresponding to the cycle $t_{CLK}$ of switching the FET 33, and after that, the switch 41 is turned off in accordance with the gate voltage supplied from the voltage detector 81.

[Operation in Fifth Exemplary Configuration of Gate Driving Circuit 31]

Figure 20:
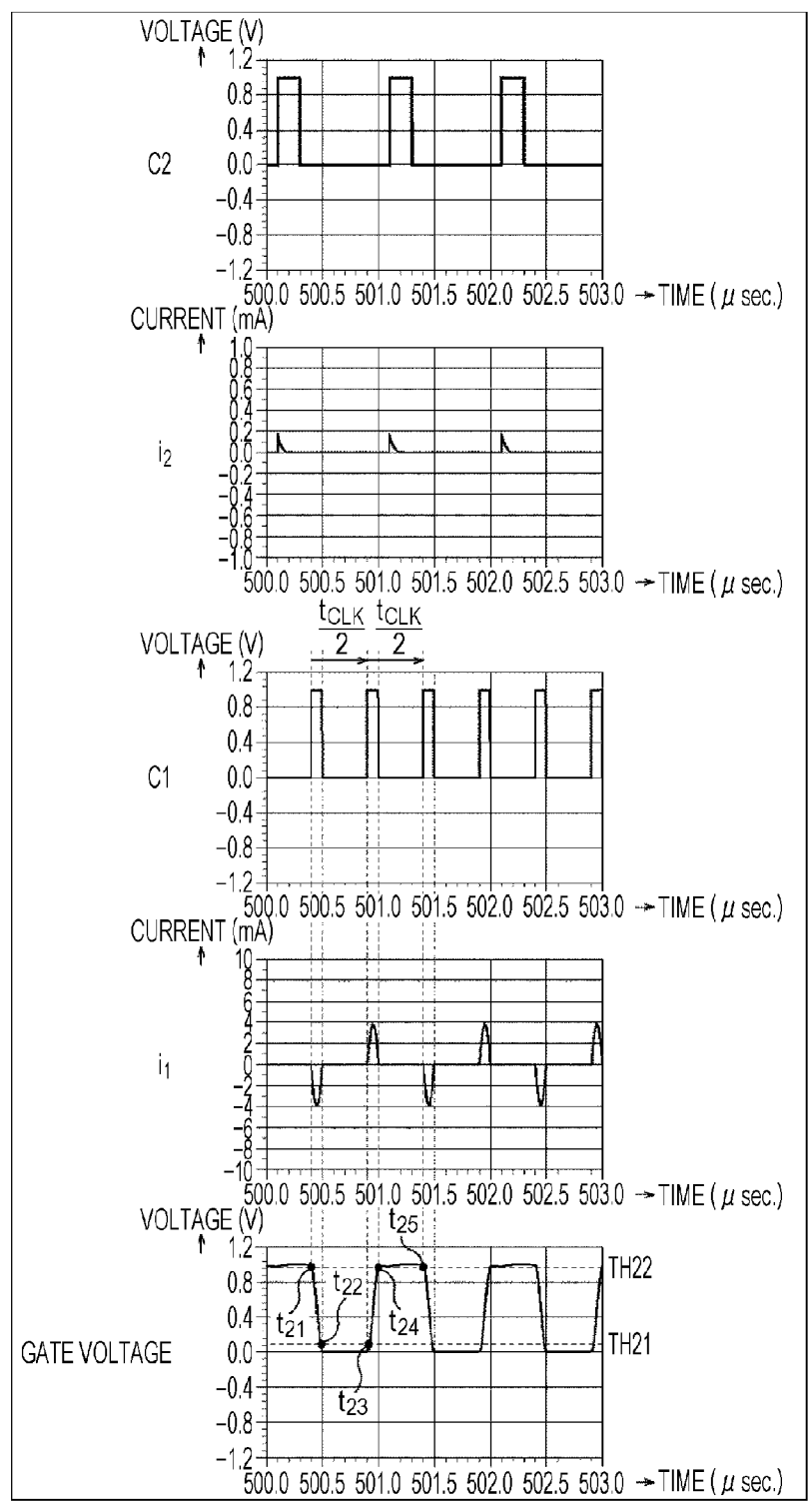
FIG. 20 is a waveform chart illustrating a control signal C2, current $i_2$ that flows by a switch 51 being turned on/off, a control signal C1, current $i_1$ that flows by a switch 41 being turned on/off, and gate voltage.

FIG. 20 is a waveform chart illustrating on/off states of the switch 51 (control signal C2), current $i_2$ flowing by the switch 51 being turning on and off, on/off states of the switch 41 (control signal C1), current $i_1$ flowing by the switch 41 being turned on and off, and gate voltage as for the gate driving circuit 31 in FIG. 19.

The on/off states of the switch 51 (control signal C2), the current $i_2$ flowing by the switch 51 being turned on and off are the same as the case described in FIGS. 5 to 8.

Further, the switch 41 (control signal C1) is turned on in the cycle $t_{CLK}/2$ as illustrated in FIG. 5.

Here, in FIG. 5, the switch 41 is turned on in the cycle $t_{CLK}/2$ and turned off after the period $t_g=\pi\sqrt{(L_g C_{iss})}$ has passed after the switch 41 was turned on, but according to the gate driving circuit 31 in FIG. 19, the controller 82 adaptively turns off the switch 41 based on the gate voltage detected by the voltage detector 81.

When the gate voltage becomes a first threshold value TH21 (or less) as a predetermined threshold value, or becomes a second threshold value TH22 (or more) which is larger than the first threshold value TH21 after the switch 41 is turned on by control of the controller 82, the switch 41 is turned off.

As a result, the current $i_1$ flows as illustrated in FIG. 20.

More specifically, for example, in the case where electric charge is accumulated in the input capacitance $C_{iss}$ now such that the gate voltage becomes the voltage $+V_{DD}$ and the switch 41 is turned on at time $t_{21}$, the electric charge accumulated in the input capacitance $C_{iss}$ sequentially flows (is discharged) from the input capacitance $C_{iss}$ to the switch 41 and the coil $L_g$, thereby causing the current $i_1$ to flow to the coil $L_g$ in the negative direction. The current $i_1$ is expressed by sine waves of the resonance cycle $2\pi\sqrt{(L_g C_{iss})}$ of the $L_g C_{iss}$ resonance circuit.

The current $i_1$ flows in the negative direction, thereby lowering the gate voltage from the voltage $+V_{DD}$.

Then, all of the electric charge accumulated in the input capacitance $C_{iss}$ is discharged, the gate voltage becomes the bias voltage $+V_{DD}/2$. Further, the current $i_1$ flowing in the coil $L_g$ tries to become zero A, but the current $i_1$ continuously flows in the coil $L_g$ in the negative direction due to inertia.

The current $i_1$ continuously flows in the coil $L_g$, thereby accumulating (charging) the electric charge in the input capacitance $C_{iss}$ such that the gate voltage becomes lower than the bias voltage $+V_{DD}/2$.

Here, in theory, the current $i_1$ flowing in the coil $L_g$ becomes zero A and the gate voltage becomes the minimum value, namely, zero V when the period which is ½ of the resonance cycle $2\pi\sqrt{(L_g C_{iss})}$ of the $L_g C_{iss}$ resonance circuit has passed from the time $t_{21}$ which is immediately before the switch 41 is turned on and the current $i_1$ starts flowing.

Therefore, in the case of setting the first threshold value TH21 at zero V, timing when the gate voltage becomes zero V which is the first threshold value TH21 is the timing when the ½ of the resonance cycle $2\pi\sqrt{(L_g C_{iss})}$ of the $L_g C_{iss}$ resonance circuit has passed from the time $t_{21}$ which is immediately before the current $i_1$ starts flowing, and it is ideal to turn off the switch 41 at this timing and fix the gate voltage to zero V which is the first threshold value TH21 and a minimum value of the gate voltage.

However, in an actual circuit, there may be a case in that the gate voltage does not become zero V which is the minimum value when the ½ of the resonance cycle $2\pi\sqrt{(L_g C_{iss})}$ of the $L_g C_{iss}$ resonance circuit has passed after the switch 41 is turned on and the current $i_1$ starts flowing.

Therefore, according to the present embodiment, a value obtained by subtracting a margin from zero V which is the minimum value of the gate voltage, more specifically, a small positive value close to zero V is set as the first threshold value TH21 of the gate voltage. The controller 82 controls the switch 41 to be turned off when the gate voltage becomes the first threshold value TH21, deeming that the ½ of the resonance cycle $2\pi\sqrt{(L_g C_{iss})}$ of the $L_g C_{iss}$ resonance circuit has passed after the current $i_1$ starts flowing.

In FIG. 20, the gate voltage becomes the first threshold value TH21 at time $t_{22}$. The switch 41 is turned off at time $t_{22}$ and the gate voltage is fixed.

The switch 41 is turned on again at time $t_{23}$ when the cycle $t_{CLK}/2$ which is ½ of the switching cycle $t_{CLK}$ of the FET 33 has passed from the time $t_{21}$ when the switch 41 was previously turned on.

When the switch 41 is turned on, the electric charge accumulated in the capacitor 63 sequentially flows (is charged) to coil $L_g$, switch 41, and the input capacitance $C_{iss}$, thereby causing the current $i_1$ to flow to the coil $L_g$ in the positive direction. The current $i_1$ is expressed by the sine waves of the resonance cycle $2\pi\sqrt{(L_g C_{iss})}$ of the $L_g C_{iss}$ resonance circuit.

The current $i_1$ flows in the positive direction, thereby raising the gate voltage.

Further, the gate voltage reaches the bias voltage $+V_{DD}/2$, and the current $i_1$ flowing in the coil $L_g$ tries to be zero A, but the current $i_1$ continuously flows in the positive direction in the coil $L_g$ due to inertia.

The current $i_1$ continuously flows in the coil $L_g$, thereby accumulating (charging) the electric charge in the input capacitance $C_{iss}$ such that the gate voltage becomes higher than the bias voltage $+V_{DD}/2$.

Here, in theory, the current $i_1$ flowing in the coil $L_g$ becomes zero A and the gate voltage becomes $+V_{DD}$ which is the maximum value when the period which is ½ of the resonance cycle $2\pi\sqrt{(L_g C_{iss})}$ of the $L_g C_{iss}$ resonance circuit has passed from the time $t_{23}$ which is immediately before the switch 41 is turned on, and the current $i_1$ starts flowing.

Therefore, in the case of setting the $+V_{DD}$ as the second threshold value TH22 which is larger than the first threshold value TH21, the timing when the gate voltage becomes the $+V_{DD}$ which is the second threshold value TH22 is the timing when the ½ of the resonance cycle $2\pi\sqrt{(L_g C_{iss})}$ of the $L_g C_{iss}$ resonance circuit has passed from the time $t_{23}$ which is immediately before the current $i_1$ starts flowing. It is ideal to turn off the switch 41 at this timing and fix the gate voltage to the $+V_{DD}$ which is the second threshold value TH22 and also the maximum value of the gate voltage.

However, in an actual circuit, there may be a case in that the gate voltage does not become $+V_{DD}$ which is the maximum value when the ½ of the resonance cycle $2\pi\sqrt{(L_g C_{iss})}$ of the $L_g C_{iss}$ resonance circuit has passed after the switch 41 is turned on and the current $i_1$ starts flowing.

Therefore, according to the present embodiment, a value obtained by subtracting a margin from $+V_{DD}$ which is the maximum value of the gate voltage, more specifically, a value close to $+V_{DD}$ and equal to or less than $+V_{DD}$ is set as the second threshold value TH22 of the gate voltage. The controller 82 controls the switch 41 to be turned off when the gate voltage becomes the second threshold value TH22, deeming that the ½ of the resonance cycle $2\pi\sqrt{(L_g C_{iss})}$ of the $L_g C_{iss}$ resonance circuit has passed after the current $i_1$ starts flowing.

In FIG. 20, the gate voltage becomes the second threshold value TH22 at time $t_{24}$. The switch 41 is turned off at time $t_{24}$ and the gate voltage is fixed.

The switch 41 is turned on again at time $t_{25}$ when the cycle $t_{CLK}/2$ which is ½ of the switching cycle $t_{CLK}$ of the FET 33 has passed from the time $t_{23}$ when the switch 41 was previously turned on. Then, the same processing is repeated afterward.

Figure 21:
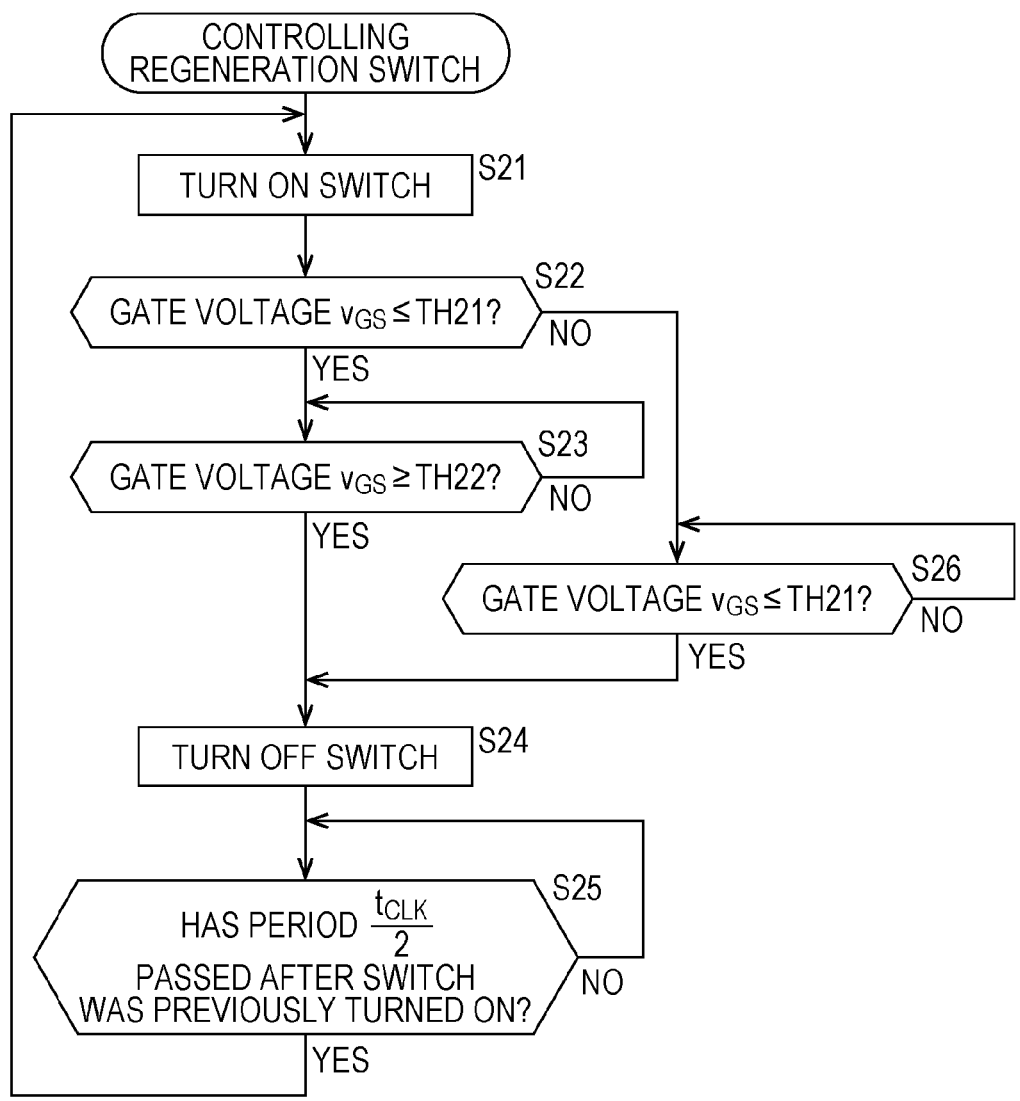
FIG. 21 is a flowchart for describing control of the switch 41 by a controller 82.

FIG. 21 is a flowchart for describing control of the switch 41 by a controller 82 in FIG. 19.

In step S21, the controller 82 turns on the switch 41, and processing proceeds to step S22.

In step S22, the controller 82 determines whether gate voltage $v_{GS}$ detected by voltage detector 81 at the time of turning on the switch 41 is the first threshold value TH21 or less.

In the case where it is determined in step S22 that the gate voltage $v_{GS}$ at the time of turning on the switch 41 is the first threshold value TH21 or less, the processing proceeds to step S23 and the controller 82 determines whether the gate voltage $v_{GS}$ detected by the voltage detector 81 has become the second threshold value TH22 or more.

In the case where it is determined in step S23 that the gate voltage $v_{GS}$ has not become the second threshold value TH22 or more, the processing returns to step S23.

In the case where it is determined in step S23 that the gate voltage $v_{GS}$ is the second threshold value TH22 or more, the processing proceeds to step S24, and the controller 82 turns off the switch 41, deeming that ½ of the resonance cycle $2\pi\sqrt{(L_g C_{iss})}$ of the $L_g C_{iss}$ resonance circuit has passed after the switch 41 was turned on. Then, the processing proceeds to step S25.

On the other hand, in the case where it is determined in step S22 that the gate voltage $v_{GS}$ at the time of turning on the switch 41 is not the first threshold value TH21 or less, the processing proceeds to step S26 and the controller 82 determines whether the gate voltage $v_{GS}$ detected by the voltage detector 81 has become the first threshold value TH21 or less.

In step S26, in the case where it is determined that the gate voltage $v_{GS}$ has not become the first threshold value TH21 or less, the processing returns to step S26.

Further, in the case where it is determined in step S26 that the gate voltage $v_{GS}$ has become the first threshold value TH21 or less, the processing proceeds to step S24, and as described above, the controller 82 turns off the switch 41, deeming that ½ of the resonance cycle $21\pi\sqrt{(L_g C_{iss})}$ of the $L_g C_{iss}$ resonance circuit has passed after the switch 41 was turned on. Then, the processing proceeds to step S25.

Here, according to the description in FIG. 20, the gate voltage $v_{GS}$ becomes the first threshold value TH11 (or less) or the second threshold value TH22 (or more) when the switch 41 is to be turned on, and after the switch 41 is turned on, the gate voltage rises from the first threshold value TH11 (or less) or lowers from the second threshold value TH22 (or more).

The timing to switch off the switch 41 is when the gate voltage $v_{GS}$ rises from the first threshold value TH11 (or less) and becomes the second threshold value TH22 and when the gate voltage $v_{GS}$ lowers from the second threshold value TH22 (or more) and becomes the first threshold value TH21.

Therefore, in FIG. 21, after confirming (determining) in step S22 that the gate voltage $v_{GS}$ at the time of turning on switch 41 is the first threshold value TH21 or less, it is determined in step S23 whether the gate voltage $v_{GS}$ rises from the first threshold value TH21 or less to the second threshold value TH22 (or more), more specifically, whether it is the timing to switch off the switch 41.

Further, in FIG. 21, in the case where it is determined in step S22 that the gate voltage $v_{GS}$ at the time of turning on the switch 41 has not become the first threshold value TH21 or less, the gate voltage $v_{GS}$ at the time of turning on the switch 41 is (must have become) the second threshold value TH22 (or more). Therefore, after that, it is determined in step S26 whether the gate voltage $v_{GS}$ lowers to the first threshold value TH21 (or less) from the second threshold value TH22 or more, more specifically, whether it is the timing to turn off the switch 41.

In step S25, the controller 82 determines whether the period $t_{CLK}/2$ has passed from (the timing) when the switch 41 was previously turned on.

In the case where it is determined in step S25 that the period $t_{CLK}/2$ has not passed from when the switch 41 was previously turned on, the processing returns to step S25.

Further, in the case where it is determined in step S25 that the period $t_{CLK}/2$ has passed from when the switch 41 was previously turned on, the processing returns to step S21 and the controller 82 turns on the switch 41. Then, the same processing is repeated afterward.

Note that all of the gate driving circuits 31 in FIGS. 15, 18, and 19 are in common in a point the switch 41 is adaptively controlled (turned off).

However, the gate driving circuits 31 in FIGS. 15 and 18 differ from the gate driving circuit 31 in FIG. 19 in a point that the gate driving circuits 31 in FIGS. 15 and 18 control the switch 41 in accordance with the current $i_1$ flowing in the coil $L_g$ while the gate driving circuit 31 in FIG. 19 controls the switch 41 in accordance with the gate voltage.

Further, the gate driving circuits 31 in FIGS. 15 and 18 consume the power regenerated in the $L_g C_{iss}$ resonance circuit to detect (measure) the current $i_1$ flowing in the coil $L_g$, thereby lowering efficiency of power regeneration. However, the threshold value TH11 (+TH11 and −TH11) can be relatively simply set because the threshold value is only to be set to a small positive value close to zero A.

On the other hand, as for the gate driving circuit 31 in FIG. 19, it is ideal to set the first threshold value TH21 and the second threshold value TH22 of the gate voltage to a minimum value and a maximum value of the gate voltage respectively. However, as described above, the first threshold value TH21 and the second threshold value TH22 of the gate voltage are respectively set to the values obtained by subtracting the margin from the minimum value and the maximum value of the gate voltage.

In the gate driving circuit 31 of FIG. 19, the margin subtracted for setting the first threshold value TH21 and the second threshold value TH22 of the gate voltage directly affect power loss of the power regenerated at the $L_g C_{iss}$ resonance circuit. More specifically, when the gate voltage lowers until becoming the first threshold value TH21 or rising until becoming the second threshold value TH22, the switch 41 is turned off and stops flow of the current $i_1$. Therefore, electric charge is not accumulated (fully charged) in the input capacitance $C_{iss}$ until the gate voltage becomes the zero V which is the minimum value or becomes +$V_{DD}$ which is the maximum value.

However, in the gate driving circuit 31 of FIG. 19, the voltage detector 81 does not substantially affect a Q value (Quality Factor) of the $L_g C_{iss}$ resonance circuit, and there is almost no power loss caused by the voltage detector 81 in the power regenerated at the $L_g C_{iss}$ resonance circuit.

Note that not the NMOS FET but a PMOS FET can be adopted as the FET 33. As for the FETs 32, 34, and 35, the same can apply.

Further, according to the present embodiment, the offset circuit 60 is provided in the gate driving circuits 31 in FIGS. 15, 18, and 19, but the gate driving circuits 31 in FIGS. 15, 18, and 19 can be configured without providing the offset circuit 60 in the same manner as the gate driving circuit 31 in FIG. 4.

[Description for Computer According to Present Technology]

Next, a series of processing in the above-described controllers 42, 52, 72, and 82 can be executed by hardware and also can be executed by software. In the case of executing the series of processing by the software, a program constituting the software is installed in a computer (processor) such as a microcomputer.

Now, FIG. 22 is a diagram illustrating an exemplary configuration according to an embodiment of the computer in which the program that executes the above-described series of processing is installed.

The program can be preliminarily recorded in a hard disk 105 or ROM 103 as a recording medium built inside the computer.

Otherwise, the program can be preliminarily stored (recorded) in a removable recording medium 111. This kind of removable recording medium 111 can be provided as so-called package software. Here, examples of the removable recording medium 111 may include a flexible disk, a CD-ROM (Compact Disc Read Only Memory), an MO (Magneto Optical) disk, a DVD (Digital Versatile Disc), a magnetic disk, and semiconductor memory.

Meanwhile, the program can be installed in the computer from the above-described removable recording medium 111 and also can be downloaded in the computer via a communication network or a broadcast network and installed in the hard disk 105 built inside. More specifically, the program can be wirelessly transferred from a download site to the computer via an artificial satellite for digital satellite broadcast, or can be transferred to the computer by wire via a network such as a LAN (Local Area Network) and the internet.

The computer includes a CPU (Central Processing Unit) 102 inside thereof, and an input/output interface 110 is connected to the CPU 102 via a bus 101.

When a command is input by a user operating an input section 107 or the like via the input/output interface 110, the CPU 102 executes the program stored inside the ROM (Read Only Memory) 103 in accordance with the command. Or, the CPU 102 loads the program stored in the hard disk 105 in RAM (Random Access Memory) 104 and executes the same.

Thus, the CPU 102 executes the processing in accordance with the above-described flowcharts or the processing executed by the configuration illustrated in the above-described block diagrams. Additionally, the CPU 102 causes, for example, processing results to be output from an output section 106 via the input/output interface 110, or to be transmitted from a communication section 108, and further to be recorded in the hard disk 105, depending on necessity.

Note that the input section 107 may include a keyboard, a mouse, a microphone, and so on. Further, the output section 106 may include an LCD (Liquid Crystal Display), a speaker, and so on.

Here, note that the processing which the computer executes in accordance with the program is not needed to be constantly executed in time-series in the order specified in the flowcharts. In other words, the processing which the computer executes in accordance with the program may include processing executed parallelly or individually (e.g., parallel processing or processing by an object).

Further, the program may be processed by one computer (processor), or may be processed by a plurality of computers in a distributed manner. Further, the program may be transferred to a distant computer for processing.

Additionally, in the present specification, a system means a group of a plurality of components (device, module (parts), etc.) and whether all of the components are included in the same unit does not matter. Therefore, any one of a plurality of devices housed in different units and connected via a network, and a device in which a plurality of modules is housed inside one unit is the system.

Note that embodiment according to the present technology is not limited to the above-described embodiment and various modifications can be made within the scope without departing from the gist of the present technology.

For example, the present technology may adopt a configuration of cloud computing whereby one function is processed by a plurality of devices via the network in a distributed and shared manner.

Further, the respective steps described in the above-mentioned flowcharts can be executed by one device and also by a plurality of devices in a distributed manner.

Furthermore, in the case where a plurality of processing is contained in one step, the plurality of processing contained in the one step can be executed by one device and also by the plurality of devices in a distributed manner.

Note that following configurations can be applied in the present technology.

[1]
A driving circuit for an FET (Field Effect Transistor), including:
a coil constituting a resonance circuit together with an input capacitance at a gate of the FET;
a first switch configured to turn on or off current flowing in the coil;
a DC power source connected to the gate of the FET in order to replenish the resonance circuit with electric charge; and
a second switch configured to turn on or off connection between the DC power source and the gate of the FET.

[2]
The driving circuit recited in [1], further including an offset circuit configured to offset voltage at the gate of the FET to voltage of a predetermined value or more.

[3]
The driving circuit recited in [2], wherein the offset circuit includes
an additional DC power source having voltage which is ½ of the DC power source,
a resistance configured to bias voltage at the gate of the FET, and
a capacitor configured to bypass current flowing in the resonance circuit.

[4]
The driving circuit recited in [3], wherein the offset circuit is a circuit in which
one end of the resistance is connected to a plus terminal of the additional DC power source,
one end of the capacitor is connected to the other end of the resistance, and
a minus terminal of the additional DC power source is connected to the other end of the capacitor, and
the other end of the coil having one end connected to the gate of the FET is connected to a connection point of the resistance and the capacitor.

[5]
The driving circuit recited in any of [1] to [4], further including a first switch controller configured to control the first switch so as to be turned on only for a period which is ½ of a resonance cycle of the resonance circuit in a cycle corresponding to a cycle of switching the FET.

[6]
The driving circuit recited in [5], further including a second switch controller configured to control the second switch so as to be periodically turned on only for a period within a period during which the first switch is turned off.

[7]
The driving circuit recited in any of [1] to [4], further including:
a current detector configured to detect current flowing in the coil; and
a first switch controller configured to control the first switch to be turned in a cycle corresponding to a cycle of switching the FET and also to be turned off in accordance with current detected by the current detector.

[8]
The driving circuit recited in any of [1] to [4], further including:
a voltage detector configured to detect voltage at the gate of the FET; and
a first switch controller configured to control the first switch so as to be turned on in a cycle corresponding to a cycle of switching the FET and also to be turned off in accordance with voltage detected by the voltage detector.

[9]
The driving circuit recited in any of [1] to [8], wherein a power source configured to execute wireless charging together with the FET is provided.

[10]
A driving method for a driving circuit for an FET (Field Effect Transistor) that includes
a coil constituting a resonance circuit together with an input capacitance at a gate of the FET,
a first switch configured to turn on or off current flowing in the coil,
a DC power source connected to the gate of the FET in order to replenish the resonance circuit with electric charge, and
a second switch configured to turn on or off connection between the DC power source and the gate of the FET,
the method including:
temporarily turning on the first switch in a cycle corresponding to a cycle of switching the FET; and
periodically turning on the second switch only for a predetermined period within a period during which the first switch is turned off.

Reference Signs List

1 FET
2 Pulse output section
11 Power transmission device
12 Power reception device 21 DC power source
22 Controller
23 Driver circuit
24 Resonance circuit
31 Gate driving circuit
32 to 35 FET
41 Switch
42 Controller
51 Switch
52 Controller
53 Resistance
54 DC power source
60 Offset circuit
61 DC power source
62 Resistance
63 Capacitor
71 Current detector
72 Controller
73 Coil
81 Voltage detector
82 Controller
101 Bus
102 CPU
103 ROM
104 RAM
105 Hard disk
106 Output section
107 Input section
108 Communication section
109 Drive
110 Input/output interface
111 Removable recording medium

The invention claimed is:

1. A driving circuit for an FET (Field Effect Transistor), comprising:
    a coil constituting a resonance circuit together with an input capacitor at a gate of the FET;
    a first switch configured to turn on or off current flowing in the coil;
    a DC power source connected to the gate of the FET through a first resistor, in order to replenish the resonance circuit with electric charge; and
    a second switch, connected in series with the first resistor, configured to turn on or off connection between the DC power source and the gate of the FET.

2. The driving circuit according to claim 1, further comprising an offset circuit configured to offset voltage at the gate of the FET to voltage of a predetermined value or more.

3. The driving circuit according to claim 2, wherein the offset circuit includes
    an additional DC power source having voltage which is ½ of the DC power source,
    a second resistor configured to bias voltage at the gate of the FET, and
    a capacitor configured to bypass current flowing in the resonance circuit.

4. The driving circuit according to claim 3, wherein the offset circuit is a circuit in which
    one end of the second resistor is connected to a plus terminal of the additional DC power source,
    one end of the capacitor is connected to the other end of the second resistor,
    a minus terminal of the additional DC power source is connected to the other end of the capacitor, and
    the other end of the coil having one end connected to the gate of the FET is connected to a connection point of the second resistor and the capacitor.

5. The driving circuit according to claim 3, further comprising a first switch controller configured to control the first switch so as to be turned on only for a period which is ½ of a resonance cycle of the resonance circuit in a cycle corresponding to a cycle of switching the FET.

6. The driving circuit according to claim 5, further comprising a second switch controller configured to control the second switch so as to be periodically turned on only for a period within a period during which the first switch is turned off.

7. The driving circuit according to claim 3, further comprising:
    a current detector configured to detect current flowing in the coil; and
    a first switch controller configured to control the first switch to be turned in a cycle corresponding to a cycle of switching the FET and also to be turned off in accordance with current detected by the current detector.

8. The driving circuit according to claim 3, further comprising:
    a voltage detector configured to detect voltage at the gate of the FET; and
    a first switch controller configured to control the first switch so as to be turned on in a cycle corresponding to a cycle of switching the FET and also to be turned off in accordance with voltage detected by the voltage detector.

9. The driving circuit according to claim 3, wherein a power source configured to execute wireless charging together with the FET is provided.

10. A driving method for a driving circuit for an FET (Field Effect Transistor) that includes
    a coil constituting a resonance circuit together with an input capacitor at a gate of the FET,
    a first switch configured to turn on or off current flowing in the coil,
    a DC power source connected to the gate of the FET in order to replenish the resonance circuit with electric charge, and
    a second switch configured to turn on or off connection between the DC power source and the gate of the FET,
    the method comprising:
    temporarily turning on the first switch in a cycle corresponding to a cycle of switching the FET; and
    periodically turning on the second switch only for a predetermined period within a period during which the first switch is turned off,
    wherein the DC power source is connected to the second switch through a resistor.

11. A driving circuit for an FET (Field Effect Transistor), comprising:
    a coil constituting a resonance circuit together with an input capacitor at a gate of the FET;
    a first switch configured to turn on or off current flowing in the coil;
    a DC power source connected to the gate of the FET in order to replenish the resonance circuit with electric charge;
    a second switch configured to turn on or off connection between the DC power source and the gate of the FET; and
    an offset circuit configured to offset voltage at the gate of the FET to voltage of a predetermined value or more,
    wherein the offset circuit includes an additional DC power source having voltage which is ½ of the DC power source, a resistor configured to bias voltage at the gate of the FET, and a capacitor configured to bypass current flowing in the resonance circuit.

* * * * *